United States Patent [19]
Kuroda et al.

[11] Patent Number: 5,381,057
[45] Date of Patent: Jan. 10, 1995

[54] ECL GATE HAVING ACTIVE PULL-DOWN TRANSISTOR

[75] Inventors: Tadahiro Kuroda, Kawasaki, Japan; David A. Gray, Santa Clara, Calif.

[73] Assignees: Kabushiki Kaisha Toshiba, Kanagawa, Japan; Synergy Semiconductor Corporation, Santa Clara, Calif.

[21] Appl. No.: 58,314

[22] Filed: May 3, 1993

[51] Int. Cl.⁶ .................. H03K 19/003; H03K 19/013
[52] U.S. Cl. ..................................... 326/126; 326/21; 327/540; 327/513
[58] Field of Search ............... 307/443, 455, 456, 246, 307/263, 310, 296.6

[56] References Cited

U.S. PATENT DOCUMENTS

| | | | |
|---|---|---|---|
| 4,874,970 | 10/1989 | Coy et al. | 307/455 X |
| 4,906,869 | 3/1990 | Masuoka | 307/455 |
| 4,948,991 | 8/1990 | Schucker et al. | 307/443 X |
| 5,012,128 | 4/1991 | Chan | 307/456 X |
| 5,072,136 | 12/1991 | Naghshineh | 307/310 X |
| 5,073,728 | 12/1991 | Ovens | 307/455 |
| 5,101,124 | 3/1992 | Estrada | 307/455 X |
| 5,216,296 | 6/1993 | Tsunoi et al. | 307/263 X |
| 5,237,216 | 8/1993 | Hayano et al. | 307/310 X |
| 5,293,083 | 3/1994 | Askin et al. | 307/443 |

*Primary Examiner*—David R. Hudspeth
*Attorney, Agent, or Firm*—Spensley, Horn, Jubas & Lubitz

[57] ABSTRACT

The present invention relates to a modified emitter coupled logic circuit which includes a differential logic stage and an emitter-follower output stage. An active pull-down circuit and a constant voltage source are included in the output stage of this circuit to allow the output of the circuit to switch from a high level to a low level at approximately the same speed as the output can switch from a low level to a high level. A particular embodiment of the present invention provides a constant voltage source comprising an operational amplifier, a reference potential generating circuit and a constant voltage signal adjusting circuit.

39 Claims, 32 Drawing Sheets

ECL GATE HAVING ACTIVE PULL-DOWN TRANSISTOR

BACKGROUND OF THE INVENTION

1. Field of the Invention.

The present invention relates to a semiconductor integrated circuit device and, in particular, to an integrated circuit device for use in an emitter coupled logic (ECL) circuit.

2. Description of the Prior Art

Emitter coupled logic (ECL) generally refers to a family of bipolar integrated circuits, often used in digital applications. ECL circuits are characterized by short propagation delay times, which are typically on the order of 1 ns. The switching speed of ECL circuits is achieved by maintaining the active devices in these circuits outside of their saturation region, and by limiting the size of changes in voltage levels associated with switching between logical states. By keeping the changes in voltages small, the delays associated with charging or discharging load capacitances or parasitic capacitances are reduced. A concise description of emitter coupled logic circuits can be found in the textbook H. Haznedar, *Digital Microelectronics* 266–91 (1991).

As an example of prior art ECL circuits, FIG. 1 shows a circuit diagram for a three input OR/NOR gate. This ECL circuit consists of two stages: (1) a differential logic stage which includes a current switch; and (2) an output emitter-follower stage acting as an output buffer circuit.

The inputs to the differential logic stage consist of three NPN transistors $Q_{1-1}$, $Q_{1-2}$ and $Q_{1-3}$, which are connected in parallel. Together these input transistors make up one branch of the differential logic stage. Input signals $IN_A$, $IN_B$ and $IN_C$ are applied to the bases of the three input transistors, respectively. The collectors of the input transistors are grounded in common through load resistor $R_1$, and the emitters of the three transistors are connected in common to a constant current source $I_{cs}$. The other branch of the differential logic stage consists of an NPN transistor $Q_2$ which has a reference potential $V_{BB1}$ applied to its base. Transistor $Q_2$ has its collector grounded through load resistance $R_2$ and its emitter connected to the constant current source $I_{cs}$. Thus, the emitters of the transistors on either side of the differential logic stage are coupled. When the voltage of one or more of the three input signals $IN_A$, $IN_B$ or $IN_C$ is higher than the reference potential $V_{BB1}$, the associated input transistor switches on and current begins to flow through the load resistance $R_1$ on the left side branch of the differential logic stage. As current begins flowing through the left side of the differential logic stage, the common emitter voltage begins to rise until transistor $Q_2$ switches off. In this state no current flows through the right side branch load resistance $R_2$. Because at least one transistor on the left side branch is switched on and because $Q_2$ is switched off, the potential at the collectors of the left side branch falls to a low "L" level and the potential at the collector of $Q_2$ increases to a high "H" level.

For most applications, an emitter-follower circuit is connected as an output stage to each of the two branches of the differential logic stage. The base of the emitter-follower NPN junction is connected to the junction point between the load resistor ($R_1$ or $R_2$) and the collector(s) of the transistor(s). Accordingly, when current is flowing through the left side of the differential logic stage, the right side output Z of the emitter-follower stage is set to the "H" level and the left side output $\overline{Z}$ of the emitter-follower stage is set to the "L" level. On the other hand, when the voltage levels of all three input signals are lower than the reference potential $V_{BB1}$, a current $I_{cs}$ flows through the right side branch so that the output Z is set to the "L" level and the left side output $\overline{Z}$ is set to the "H" level. In the manner described above, it is possible to obtain a logical output Z that is indicative of the three input OR operation: $Z = A + B + C$.

For the circuit shown in FIG. 1, when $Q_2$ is switched off so that the right branch potential increases from the "L" level to the "H" level, the Z output switches at a fast speed because the Z output is driven by emitter-follower transistor $Q_4$. In contrast, when $Q_2$ is switched on and the Z output of the right side emitter-follower stage decreases from the "H" level to the "L" level, either the switching operation will be slow, or excessive levels of power will be consumed for high speed switching. It is difficult to achieve high speed operation while maintaining power consumption at an optimum level—for prior art ECL circuits, circuit optimization involves a trade-off between high speed and low power operation. This is because the output load is discharged by the current $I_{EF}$ that flows from the constant current source through an equivalent resistance $R_E$ (not shown). To change the output Z of the emitter-follower stage from the "H" level to the "L" level at high speed, a large current $I_{EF}$ (or a small equivalent resistance $R_E$) is required, so that the power consumption increases. This power is consumed throughout steady state operation; that is, power is consumed even when the ECL gate output is not being switched. To reduce this power loss, either the current $I_{EF}$ must be reduced or the resistance $R_E$ must be increased. However, reducing the current flow in this way causes the switching time to increase to an unacceptable level.

As an illustration of this problem, FIG. 3 shows the results of a simulation in which an output of the ECL inverter circuit shown in FIG. 2 (similar to the circuit shown in FIG. 1) is used to drive different output loads ($C_L = 0.04$ pF, 0.5 pF, and 1.0 pF) under the condition that $I_{EF} = 235$ µA. FIG. 3 indicates that the time required to switch from an "H" state to an "L" state is relatively long even for a load capacitance of 0.5 picofarads. By comparison, the time required to switch the Z output from the "L" level to the "H" level increases much more slowly with increasing load capacitances. The disadvantageous power consumption of this circuit is also demonstrated by the FIG. 3 simulation, which shows the constant pull-down current $I_{EF}$ required by the FIG. 2 ECL circuit.

The fact that the switching time from an "H" to an "L" ($t_{pHL}$) is markedly slower than the switching time from an "L" to an "H" ($t_{pLH}$) diminishes the overall performance of LSI circuits which use this type of ECL circuit. Slow and asymmetric switching times can cause an erroneous operation of the circuit due to signal skew (signal drift) or because of a racing condition in which the sequence of switching becomes reversed for competing signals. Furthermore, the heat generated by the large power consumption reduces the reliability of the ECL integrated circuit.

It is accordingly an object of the present invention to provide a circuit for ECL applications that achieves symmetric, fast switching times at low levels of power consumption.

SUMMARY OF THE INVENTION

In accordance with one aspect of the present invention, an integrated circuit is provided which includes a first and a second transistor coupled together. A third transistor is coupled through its base to the collector of the first transistor; the emitter of the third transistor is characterized by a node potential. The circuit further includes a resistive element coupled to the collector of the second transistor and to the emitter of the third transistor. A fourth transistor is coupled through its collector to the emitter of the third transistor and the collector of the second transistor is coupled to the base of the fourth transistor. The circuit also includes a constant voltage source coupled to the emitter of the fourth transistor. In operation, the constant voltage source is regulated such that the time required for the node potential at the emitter of the third transistor to switch from a first level to a second level is substantially equal to the time required for the node potential to switch from its second level to its first level.

Another aspect of the present invention provides a circuit including a differential logic circuit having an input branch and an output branch, where the output branch is characterized by at least a first and a second output state. This circuit includes a constant voltage source coupled to the output branch of said differential logic circuit, where the constant voltage source supplies a constant voltage signal to the output branch of the differential logic circuit. An active circuit element couples the differential logic circuit to the constant voltage source. The constant voltage signal is such that the time required for the output branch to switch from its first to its second output state is substantially equal to the time required for the output branch to switch from its second to its first output state.

DETAILED DESCRIPTION OF THE PREFERRED EMBODIMENTS

Embodiments of the present invention are described herein with reference to the attached drawings.

Figure 1:
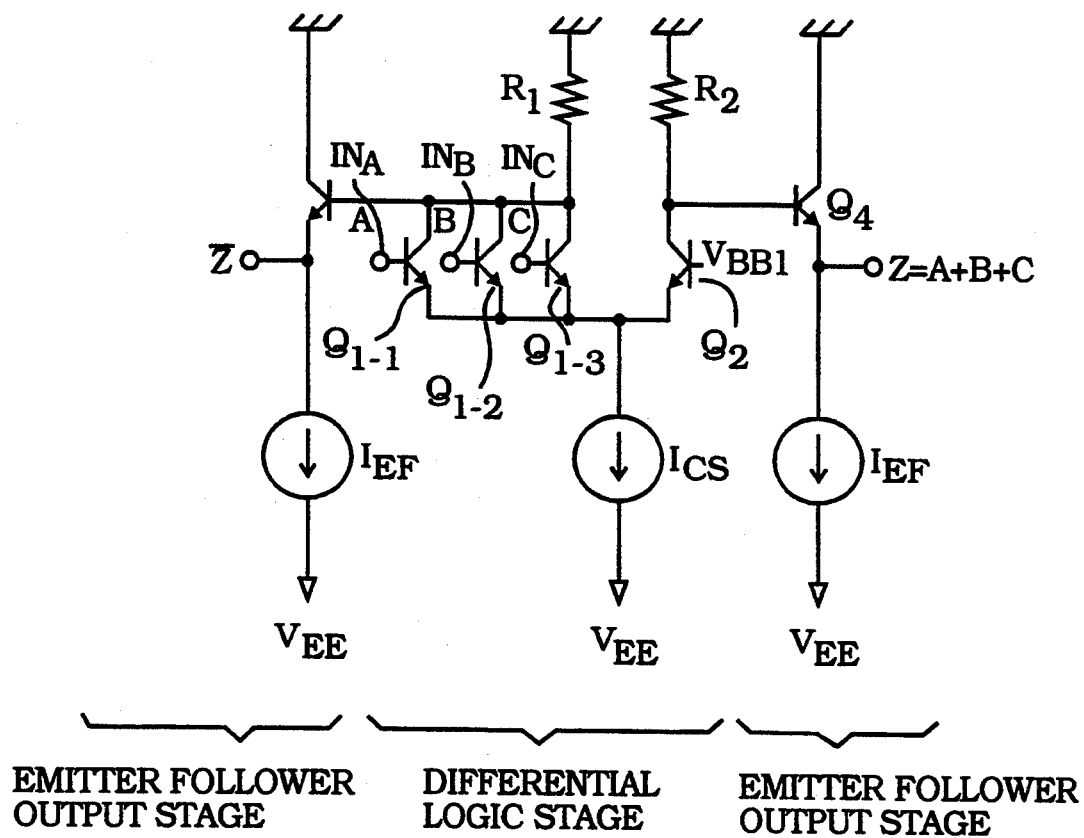
FIG. 1 is a circuit diagram showing a prior art 3-input OR/NOR ECL gate.
Figure 2:
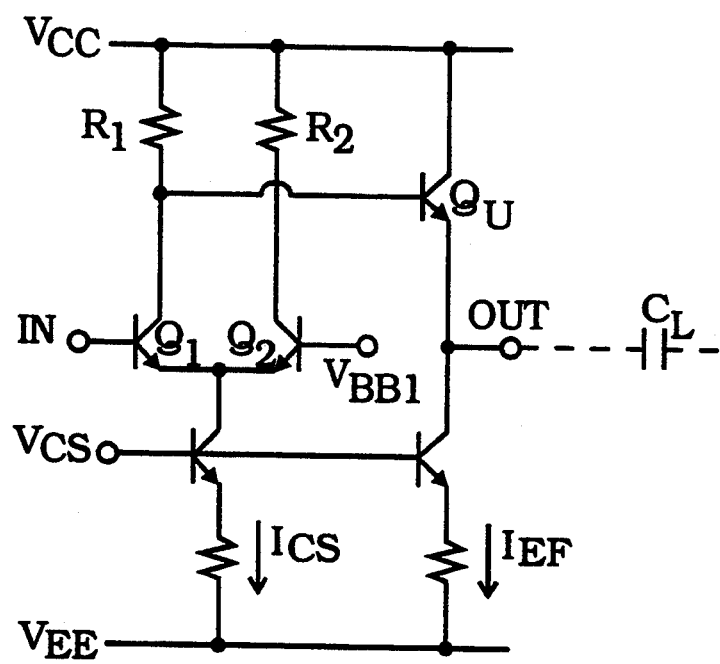
FIG. 2 is a circuit diagram showing a prior art ECL inverter circuit.
Figure 4:
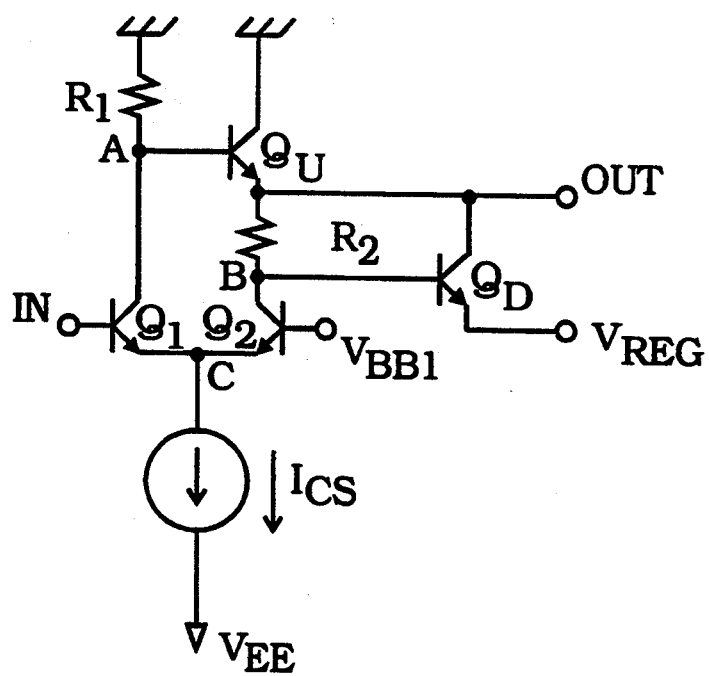
FIG. 4 is a circuit diagram showing an improved ECL inverter circuit of the active pull-down type.

The circuit shown in FIG. 4 is an example of what is referred to herein as an active pull-down ECL circuit or APD circuit. An APD circuit can include an output stage which provides a large transient current during switching operations, but which consumes a small current during steady state operation to reduce power consumption. In the embodiment shown in FIG. 4, an APD circuit is composed of two NPN transistors $Q_1$ and $Q_2$ which make up a differential logic stage. An input signal IN is applied to the base of NPN transistor $Q_1$, and a resistor $R_1$ couples the collector of this transistor $Q_1$ to a reference potential which is typically ground. Connection node A between resistor $R_1$ and the collector of $Q_1$ is coupled to the base of a charging bipolar transistor $Q_u$. The collector of transistor $Q_u$ is typically grounded, and the emitter of $Q_u$ is coupled to the collector of a transistor $Q_2$ by resistor $R_2$. A reference potential $V_{BB1}$ is supplied to the base of transistor $Q_2$. The node between the emitter of transistor $Q_u$ and resistor $R_2$ is coupled to the collector of a discharging NPN bipolar transistor $Q_D$ and to an output terminal OUT. The base of transistor $Q_D$ is coupled to node B between resistor $R_2$ and the collector of transistor $Q_2$. A reference potential $V_{REG}$ is applied to the emitter of transistor $Q_D$. This reference potential is $V_{REG} = \text{``L''} - V_{BE}$, which is typically about $-2.3$ V.

Figure 6:
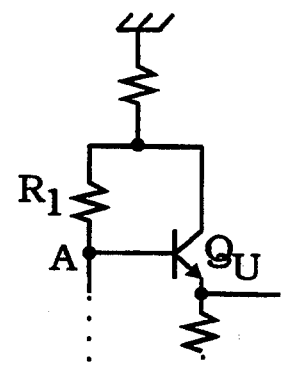
FIG. 6 is a circuit diagram for shifting the output potential downward.
Figure 7:
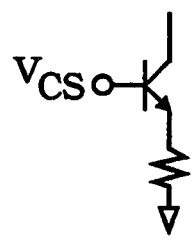
FIG. 7 is a circuit diagram showing an example of a constant current source.
Figure 8:
FIG. 8 is a circuit diagram showing another example of a constant current source.
Figure 9:
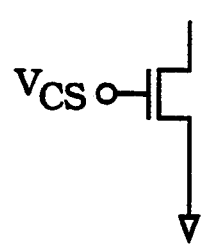
FIG. 9 is a circuit diagram showing still another example of a constant current source.

For the circuits shown in FIG. 4 and throughout the following description, the resistance $R_1$ and the collector of the transistor $Q_u$ can be coupled in common through a resistor to ground as shown in FIG. 6. The constant current source $I_{CS}$ of the differential logic stage can be, for example, a bipolar transistor in series with a resistor, where the transistor is controlled by voltage $V_{CS}$ which is applied to the base of the transistor as shown in FIG. 7. In other embodiments, the constant current source simply can be a bipolar transistor controlled by the voltage $V_{CS}$. Alternately, the constant current supplied to the differential logic stage can be supplied through a resistor $R_E$ as shown in FIG. 8 or by a MOS transistor having a gate to which a voltage $V_{CS}$ is applied as shown in FIG. 9.

The switching operation of the circuit shown in FIG. 4 will now be described. Typical operating conditions are adopted for the following description: the high (``H'') logic level is about $-0.8$ V; the low (``L'') logic level is about $-1.5$ V; the $V_{BB1}$ (the first logic threshold value) is about $-1.15$ V; the $V_{BB2}$ (the second logic threshold value) is about $-1.95$ V; the reference potential $V_{REG}$ is about $-2.3$ V; and the base-emitter voltage $V_{BE}$ required to turn on the NPN bipolar transistor is about 0.8 V.

First, the operation of the FIG. 4 circuit is described starting from the initial conditions that IN=``H'' and OUT=``L''. In this state, current is flowing through transistor $Q_1$. When the input signal is switched low (IN=``L'') the differential logic stage switches so that a signal OUT=``H'' is produced. When the IN=``L'' signal is applied, the transistor $Q_1$ of the differential logic stage is turned off and $Q_2$ is turned on, so that the current $I_{CS}$ flows through $Q_2$ on the right side branch of the differential logic stage. Consequently, the initial potential difference across the resistor $R_1$ ($I_{CS} \times R_1 = \text{``H''} - \text{``L''} = 0.7$ V) drops to zero, and the potential at node A rises from $-0.7$ V to about 0 V. As the potential at node A increases, the voltage across the base and emitter of the charging transistor $Q_u$ increases to greater than 0.8 V, which turns on transistor $Q_u$ strongly allowing a large charging current to flow and causing OUT to switch from ``L'' to ``H''.

Before $Q_u$ switches on, the potential at node B is ``L'', because $I_{CS}$ does not flow through $Q_2$ initially so that the potential at B is the same as that at OUT. After $Q_u$ switches on, the portion of the $Q_u$ charging current corresponding to $I_{CS}$ flows through resistor $R_2$ and through transistor $Q_2$ into the constant current source. As a result, the potential at node B drops from ``L'' to ``L'' $-$ (``H'' $-$ ``L'') $= -2.2$ V, causing transistor $Q_D$ to turn off. Once $Q_D$ switches off, the major part of the charging current from $Q_u$ flows through whatever load is connected to OUT, so that the potential at OUT rises abruptly. When the potential at OUT reaches the ``H'' level, the voltage across the base and emitter of $Q_u$ is reduced to 0 −"H"=0.8 V, which causes $Q_u$ to gradually turn off.

As the potential at OUT reaches the "H" level, the potential at node B reaches "H"−("H"−"L")="L" (the values of $R_1$, $R_2$ and $I_{CS}$ being fixed so that $R_1 \times I_{CS} = R_2 \times I_{CS} =$ "H"−"L"), and the voltage across the base and emitter of $Q_D$ increases to "L"−$V_{REG}$=0.8 V, gradually turning $Q_D$ on. Accordingly, when the potential at OUT reaches the "H" level, both $Q_u$ and $Q_D$ are turned on slightly and a small current $I_{CO}$ flows by way of GND→$Q_u$→$Q_D$→$V_{REG}$.

Next, the switching operation of the FIG. 4 circuit will be described starting from the initial conditions that IN="L" and OUT="H", into which the signal IN="H" is input to cause the signal OUT to decrease to "L". In response to the input signal IN="H", the transistor $Q_1$ of the differential logic stage is turned on and $Q_2$ is turned off, so that the current $I_{CS}$ flows through the left side branch of the differential logic stage. As a result, the potential difference across the resistor $R_1$ becomes $I_{CS} \times R_1$="H"−"L", and the potential at node A drops to about −0−("H"−"L")=0.7 V, causing $Q_u$ to turn off. As $Q_2$ turns off, the potential across resistor $R_2$ of $I_{CS} \times R_2$="L"−"L" decreases, so that the voltage between the base and emitter of the discharging transistor $Q_D$ rises to higher than "L"−$V_{REG}$=0.8 V, and $Q_D$ turns on strongly.

Consequently, a large discharge current flows through the load connected to OUT through $Q_D$ and into the $V_{REG}$, causing the potential at OUT to drop abruptly. As the potential at OUT decreases to "L", the potential at node B decreases to "L", and the voltage across the base and emitter of $Q_D$ falls to "L"−$V_{REG}$=0.8 V, causing $Q_D$ to gradually turn off again. At the same time, the voltage across $Q_u$ rises to −("H"−"L")−"L"=−"H"=0.8 V, and $Q_u$ turns on gradually. Accordingly, when OUT reaches "L", both $Q_u$ and $Q_D$ turn on slightly, and a small current $I_{CO}$ flows by way of GND→$Q_u$→$Q_D$→$V_{REG}$.

Figure 5:
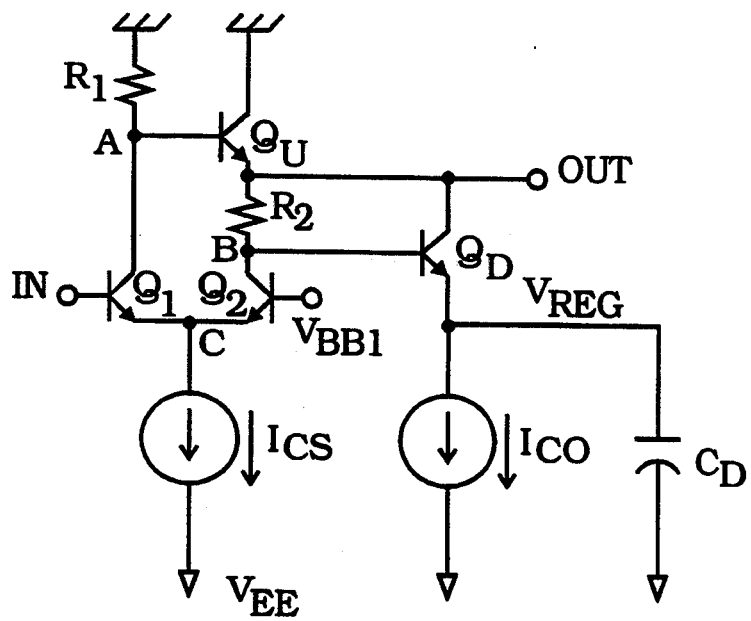
FIG. 5 is a circuit diagram showing a modification of the circuit shown in FIG. 4, in which $V_{REG}$ is provided.
Figure 10:
FIG. 10 is a circuit diagram showing an example of a particular capacitor configuration.

One method that can be used to produce the reference voltage $V_{REG}$ is the "constant current" method. In one embodiment of the constant current method, the emitter of transistor $Q_D$ is coupled to the supply voltage $V_{EE}$ using a parallel circuit composed of a constant current source $I_{CO}$ and a capacitor $C_D$, as is shown in FIG. 5. In this particular embodiment, the potential $V_{REG}$ is automatically set to a potential (typically, about −2.3 V) at which the current passing by way of GND→$Q_u$→$Q_D$→$V_{REG}$ becomes $I_{CO}$. The large load discharging current necessary for transient switching is supplied through capacitor $C_D$. Alternately, the capacitor $C_D$ shown in FIG. 5 can be replaced with a transistor whose collector and emitter are connected to each other (see FIG. 10). In practice, capacitor $C_D$ can also be realized easily using two parallel arranged metallic wires or a structure having a polysilicon electrode.

Figure 11:
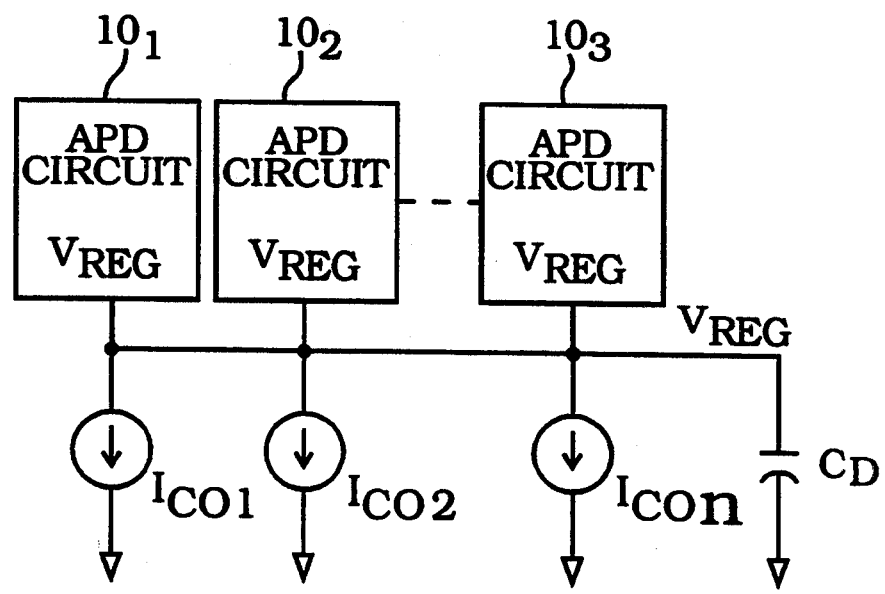
FIG. 11 is a circuit diagram showing an example in which the capacitance $C_D$ shown in FIG. 5 is used in common by a plurality of active pull-down (APD) circuits.

In the circuit shown in FIG. 5, the capacitor $C_D$ can be used to supply $V_{REG}$ in common to a plurality of APD circuits. For instance, in the case of the APD circuits shown in FIG. 11, a current source is provided for each of the n APD circuits $10_1, \ldots 10_n$, and capacitor $C_D$ is used in common for all n circuits. The APD circuits $10_1, \ldots 10_n$ shown in FIG. 11 may be similar to the one shown in FIG. 4. This "constant current" method of supplying $V_{REG}$ has certain disadvantages for high speed switching circuits: the constant current method requires that the capacitor $C_D$ be chosen to match the loads driven by the circuit.

It is desirable to incorporate certain peripheral circuitry to optimize the switching performance of circuits in accordance with the present invention. Certain preferred embodiments of the present invention incorporate peripheral circuitry for generating the a regulated constant voltage signal $V_{REG}$.

In accordance with one aspect of the present invention, a constant voltage APD (active pull-down) circuit is implemented in a number of circuits. For a constant voltage APD circuit, large transient charging and discharging currents flow only during switched operation, and since the transient charging and discharging currents are supplied according to the magnitude of a load, it is unnecessary to optimize constant voltage APD circuits for different loads. In addition, since the switching time of an output stage in accordance with the present invention can be kept constant irrespective of the output data, it is possible to improve the power consumption and the delay time markedly. Furthermore, since an appropriate reference voltage can be supplied, the $V_{REG}$ value can be set properly at all times, irrespective of how many APD circuits are connected or of fluctuations in the supply voltage $V_{EE}$ or temperature $T_j$. Circuits incorporating constant voltage APD circuits thus realize stable operation.

Figure 12:
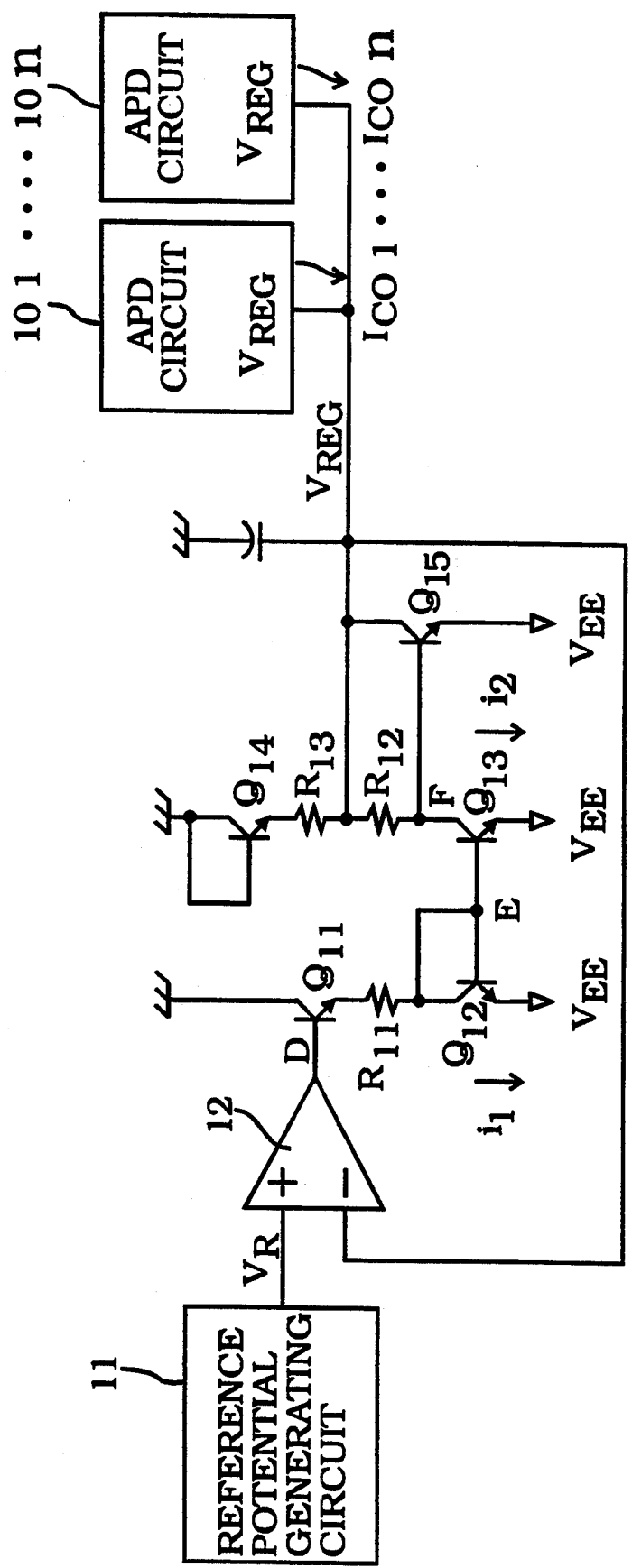
FIG. 12 is a circuit diagram showing an embodiment of the present invention, in which an appropriate voltage $V_{REG}$ is given.

FIG. 12 shows a circuit diagram of an embodiment of the present invention incorporating a plurality of APD circuit elements, each of which may, for example, be similar to the APD circuit shown in FIG. 4. Here, the reference numerals $10_1, \ldots 10_n$ denote the n different APD circuits acting as circuit element within the larger circuit. The FIG. 12 circuit incorporates a constant voltage APD circuit in accordance with the present invention. A reference potential generating circuit 11 generates a target voltage $V_R$ used to adjust the relative level of the voltage $V_{REG}$ in the FIG. 12 circuit. Target voltage $V_R$ is applied to the non-inverting input terminal of an operational amplifier 12. The $V_{REG}$ signal to be adjusted is applied to the inverting input of the operational amplifier; this $V_{REG}$ signal acts as a feedback input so that the operational amplifier 12 adjusts its output (at node D) so that $V_{REG}$ equals the desired target voltage $V_R$.

The following describes voltage regulation within the FIG. 12 circuit. When the non-inverting input to the operational amplifier is greater than the voltage at the inverting input, i.e., $V_{REG} < V_R$, the potential at node D rises. Node D is coupled through the base of the input transistor $Q_{11}$ to a current mirror circuit composed of two common-emitter NPN transistors $Q_{12}$ and $Q_{13}$. Therefore, as the output from the operational amplifier increases, the current $i_1$ flowing through resistor $R_{11}$ and transistor $Q_{12}$ increases.

Because transistors $Q_{12}$ and $Q_{13}$ form a current mirror circuit, the ratio between the currents flowing through these transistors remains constant. Thus, when the output of the operational amplifier 12 causes $i_1$ to increase, the current $i_2$ increases proportionally. The collector of transistor $Q_{13}$ (node F) is coupled to ground through resistors $R_{12}$ and $R_{13}$ and through transistor $Q_{14}$, whose collector and base are connected to each other. Node F is also connected to the base of transistor $Q_{15}$. The emitter of $Q_{15}$ is connected to supply voltage $V_{EE}$, and the collector of $Q_{15}$ is connected to a point between the resistors $R_{12}$ and $R_{13}$. The voltage across resistor $R_{12}$ increases as current $i_2$ increases. Since $V_{REG}$ is the sum of the voltage across the base and emitter of $Q_{15}$ and the voltage drop across resistor $R_{12}$, $V_{REG}$ also rises. The base-emitter voltage across $Q_{15}$ is roughly constant at $V_{BE}=0.8$ V, so the change in $V_{REG}$ is essentially equal to the change in the voltage drop across resistor $R_{12}$ (i.e., $\delta V_{REG} \approx \delta i_2 \times R_{12}$). Similarly, when $V_{REG} > V_R$, the current mirror circuit acts to lower $V_{REG}$, thus causing $V_{REG}$ to be adjusted so that $V_{REG} = V_R$.

Figure 13:
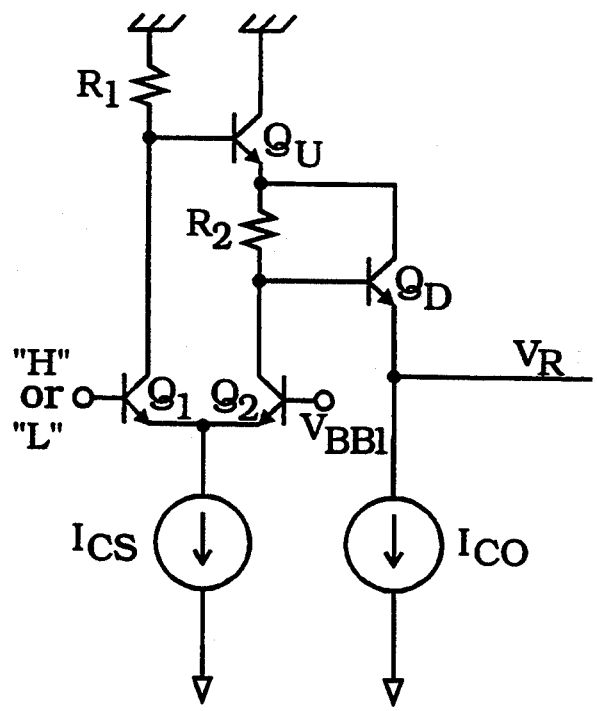
FIG. 13 is a circuit diagram showing an example of a reference potential generating circuit for use in the circuit shown in FIG. 12.
Figure 14:
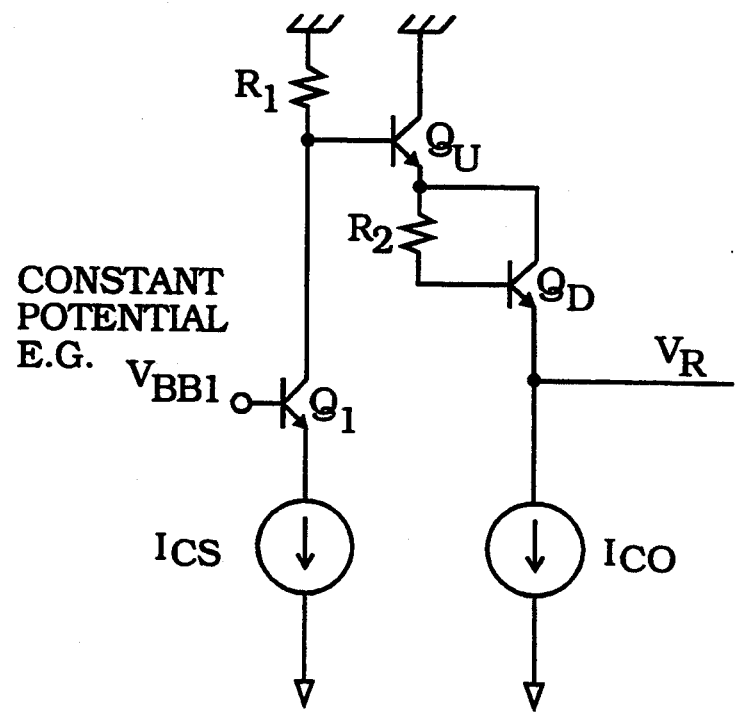
FIG. 14 is a circuit diagram showing another example of the reference potential generating circuit for use in the circuit shown in FIG. 12.
Figure 15:
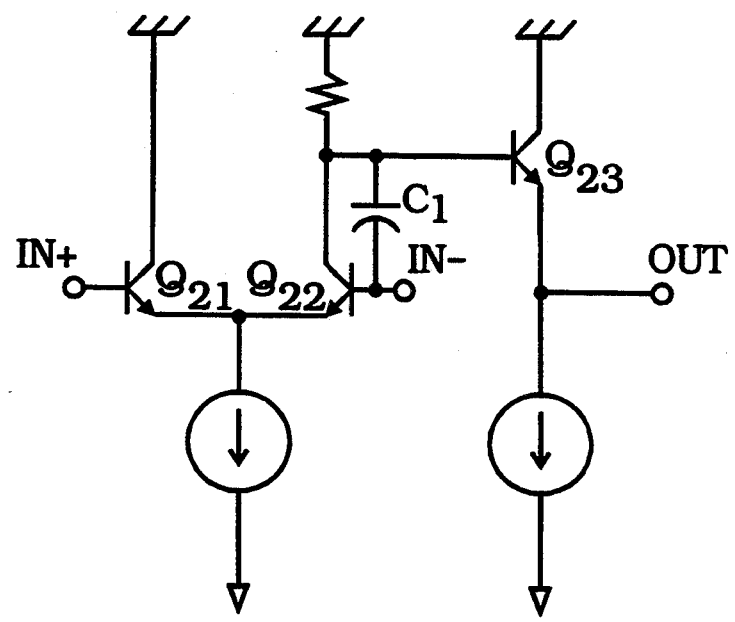
FIG. 15 is a circuit diagram showing an example of the operational amplifier for use in the circuit shown in FIG. 12.

Here, the reference potential generating circuit 11 (shown in FIG. 13) may be similar to the embodiment of an APD circuit shown in FIG. 5. However, it is also possible to use other roughly equivalent circuits such as that shown in FIG. 14. FIG. 15 is a circuit diagram showing an embodiment of the operational amplifier 12 (FIG. 12), in which the differential amplifier is composed of two transistors $Q_{21}$ and $Q_{22}$ and a phase compensation capacitance $C_1$ is connected between the inverting input terminal and the base of output transistor $Q_{23}$. This capacitor $C_1$ is used in preferred embodiments of the present invention, but may not be necessary for all embodiments of the present invention. In these drawings and in the drawings that follow, the same reference numerals have been retained for circuit elements which have similar functions to those circuit elements shown in FIGS. 4 and 5, to facilitate the understanding of the mutual functional relationship and similarity therebetween.

By using circuits such as those described above, the potential $V_{REG}$ is established and stabilized under feedback control by the operational amplifier, such that the currents $I_{CO1}$ to $I_{COn}$ which flow into the n APD circuits connected to the $V_{REG}$ line are approximately equal to the current $I_{CO}$ determined by the reference potential generating circuit 11.

Figure 16:
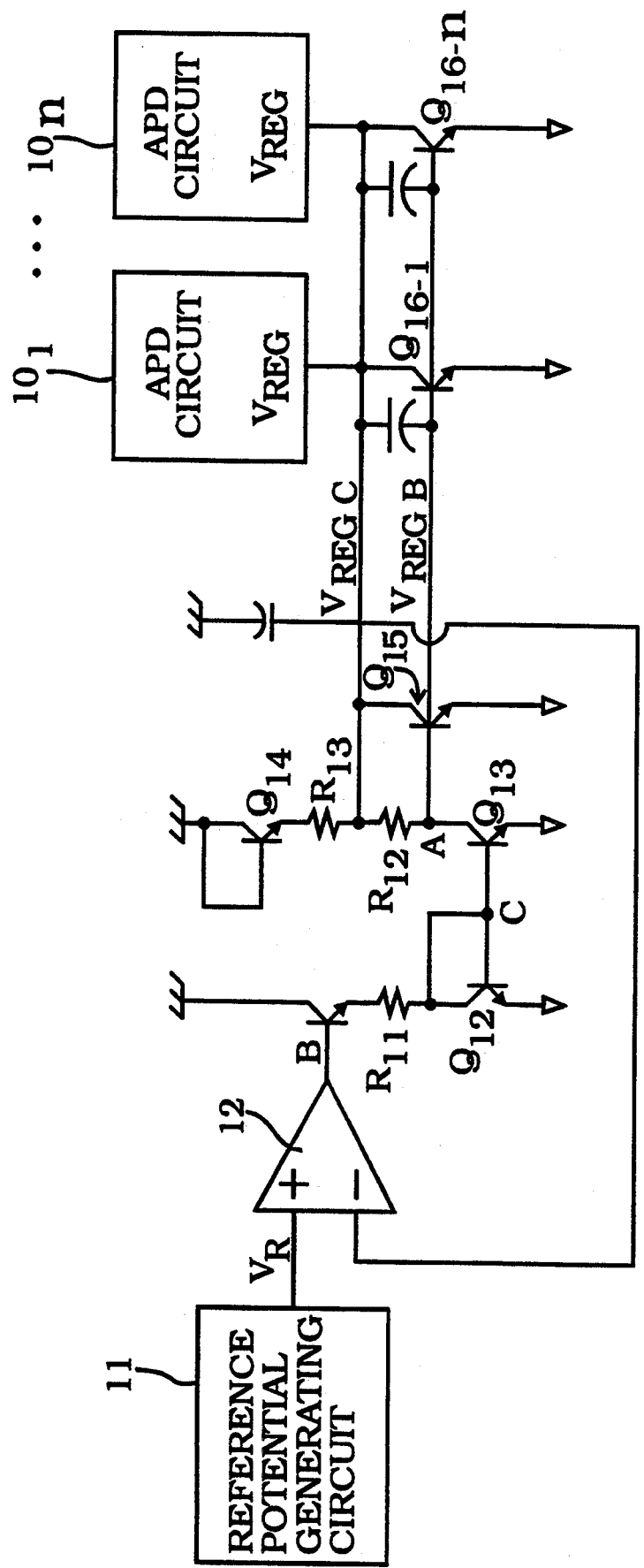
FIG. 16 is a circuit diagram showing an alternate embodiment in which the transistor $Q_{15}$ shown in FIG. 12 is divided and distributed in the proximity of each of a plurality of APD circuits.

Referring again to FIG. 12, the discharge current generated by the switching of any of the APD circuits connected to the $V_{REG}$ line flows from $V_{REG}$ to $V_{EE}$ via the output transistor $Q_{15}$. If a large parasitic resistance exists in the $V_{REG}$ line, the $V_{REG}$ voltage decreases with increasing distance away from $Q_{15}$ along the $V_{REG}$ line. For a resistive $V_{REG}$ line, it is difficult to maintain the $V_{REG}$ voltage during APD circuit switching. FIG. 16 shows a modification of the circuit shown in FIG. 12, which can solve this problem. The FIG. 12 circuit is modified by adding a $V_{REGB}$ line which extends from the base of the output transistor $Q_{15}$. This $V_{REGB}$ line is connected to the bases of transistors $Q_{16-1}, \ldots Q_{16-n}$ and the collectors of these transistors are connected to the $V_{REGC}$ line which provides the constant voltage signal to the n APD circuits. In the circuit shown in FIG. 16, the addition of a second regulated voltage line allows the discharging transient current of the load to be at least partially dispersed via the transistors $Q_{16-1}$ to $Q_{16-n}$. In essence, the $Q_{16-1}$ to $Q_{16-n}$ transistors act similarly to output transistor $Q_{15}$, allowing at least a portion of the discharge circuitry to be discharged in the vicinity of the APD circuit being switched. By adding the second regulated voltage line, it is possible to reduce the variations in the $V_{REGC}$ voltage that are generated during switching due to the parasitic resistance along the $V_{REGC}$ line. Accordingly, this circuit shown in FIG. 16 is advantageous for use in large circuits in which the parasitic resistance along the $V_{REG}$ line can be large, or for when a great number of the APD circuits are operated simultaneously, resulting in increased discharge currents during switching operation. In preferred embodiments, a capacitor may be connected between the two $V_{REGC}$ and $V_{REGB}$ lines to improve the response speed of the transistors $Q_{16-1}$ to $Q_{16-n}$ in the transient state. However, this capacitor is not always necessary.

Also, the capacitor connecting $V_{REGC}$ to ground is not always necessary since this capacitor is for phase compensation.

Figure 17:
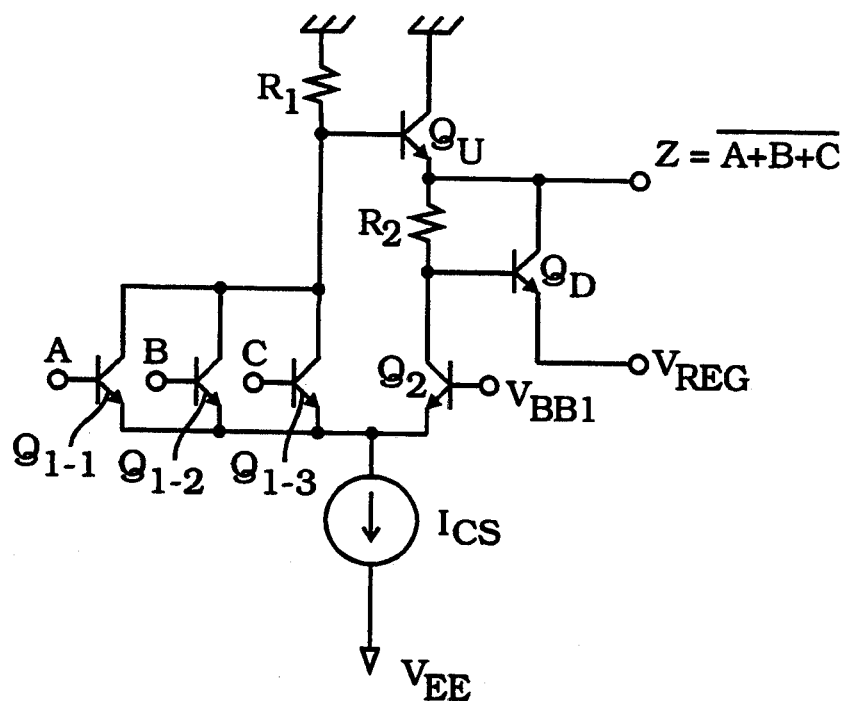
FIG. 17 is a circuit diagram showing a 3-input NOR gate, to which the embodiment of an APD circuit shown in FIG. 4 is applied.
Figure 18:
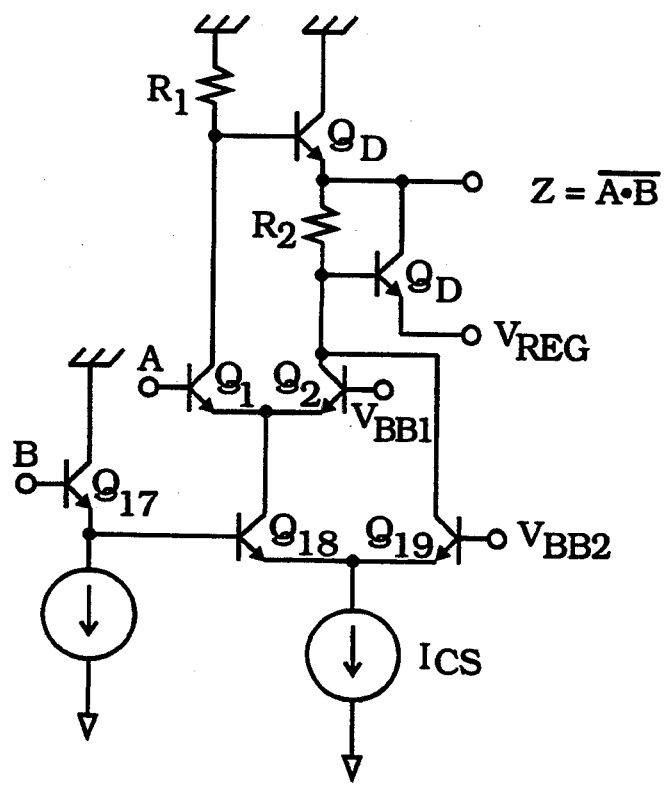
FIG. 18 is a circuit diagram showing a 2-input NAND gate, to which the embodiment of an APD circuit shown in FIG. 4 is applied.
Figure 19:
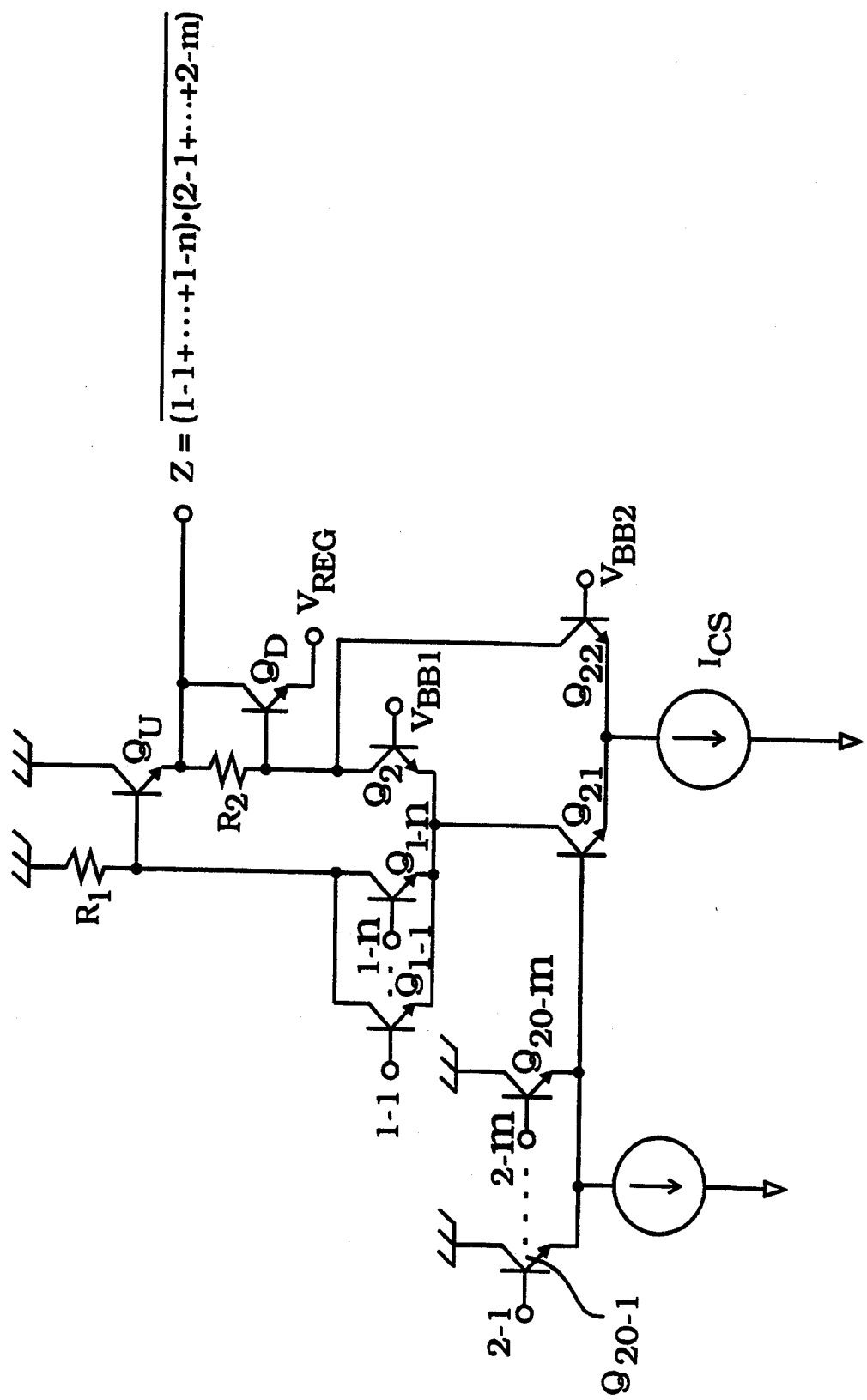
FIG. 19 is a circuit diagram showing an example of a multi-input OR-NAND composite gate, to which the embodiment of an APD circuit shown in FIG. 4 is applied.

In FIG. 4, one embodiment of an APD circuit is applied to an inverter gate. However, APD circuits can be applied to many other ECL gates as shown in FIGS. 17 to 19. In the embodiment shown in FIG. 17, an embodiment of an APD circuit is incorporated into a 3-input NOR gate having three input transistors $Q_{1-1}$, $Q_{1-2}$ and $Q_{1-3}$ connected in parallel on one side of the differential logic stage. In the embodiment shown in FIG. 18, an APD circuit is used in a 2-input NAND gate having two differential logic stages. Further, in the embodiment shown in FIG. 19, an APD circuit is used in a multi-input OR-NAND composite gate having a 2-input NAND gate. Each stage of the NAND gate is composed of an OR gate having n input transistors $Q_{1-1}$, $\ldots Q_{1-n}$ connected in parallel and an m-input OR gate made up of m transistors $Q_{20-1}, \ldots Q_{20-m}$ connected in parallel.

Further, in the above-mentioned embodiments, although APD circuits are used to form gates having sin inverted output, an aspect of the present invention can be used to obtain a non-inverted output. In that case, however, it is preferably to include a level shifting circuit to prevent the input transistors of the differential logic stage from being saturated.

Figure 20:
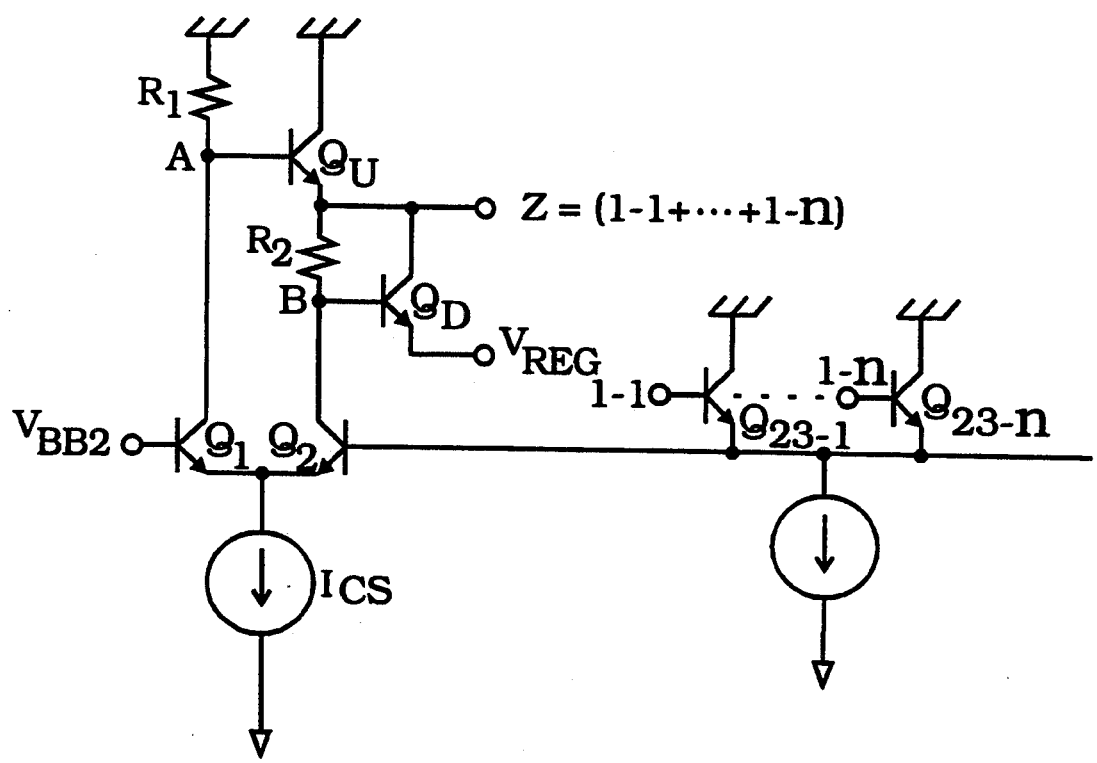
FIG. 20 is a circuit diagram showing an example of a multi-input OR gate, to which the embodiment of an APD circuit shown in FIG. 4 is applied.
Figure 21:
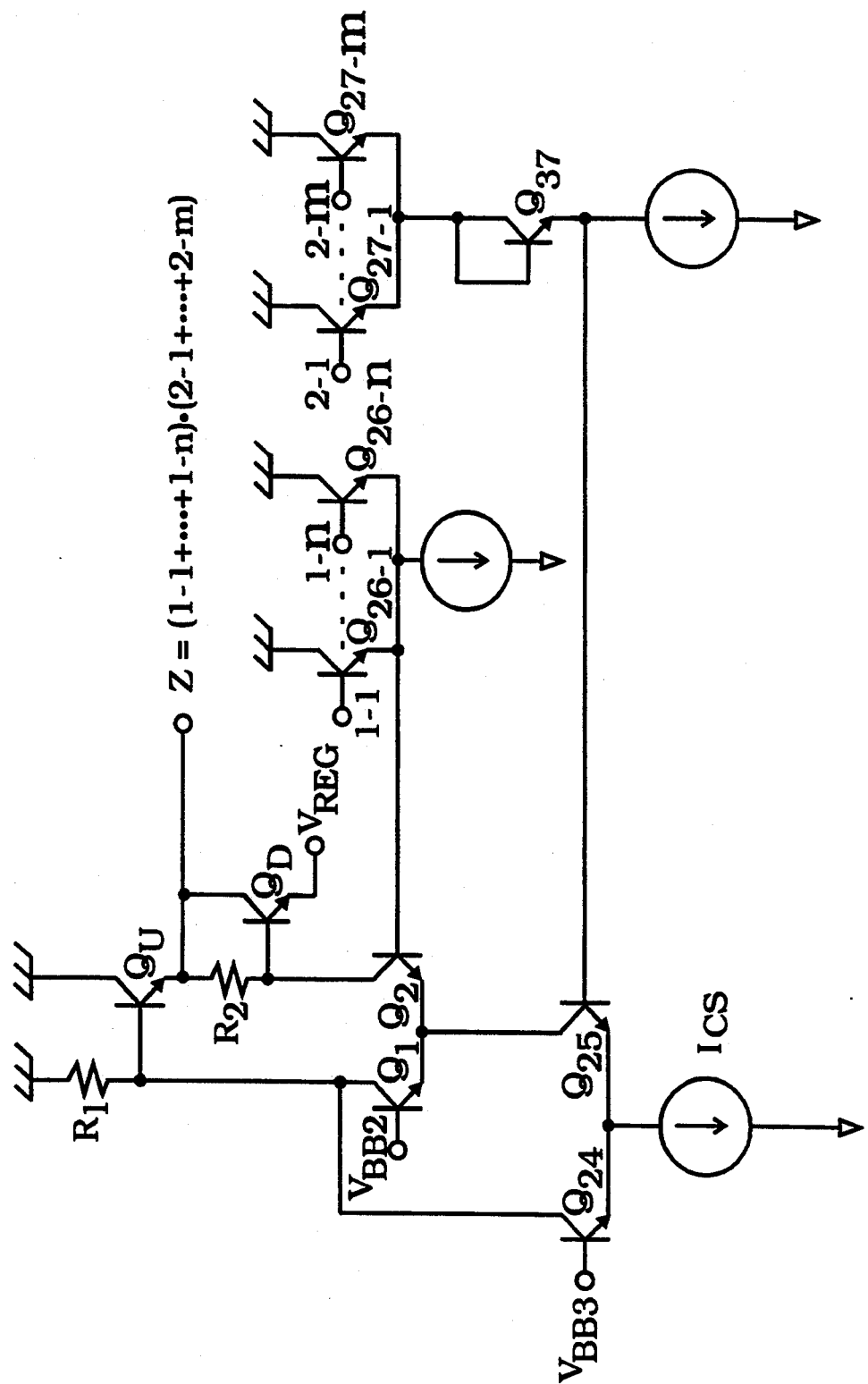
FIG. 21 is a circuit diagram showing an example of a multi-input OR-AND composite gate, to which the embodiment of an APD circuit shown in FIG. 4 is applied.

FIG. 20 is a circuit diagram for an APD circuit used as a multi-input OR gate, in which n transistors $Q_{23-1}, \ldots Q_{23-n}$ whose collectors are grounded and whose emitters are connected in common to the base of the transistor $Q_2$. In operation, the collector of transistor $Q_2$ is connected to a node B and is substantially maintained at a low "L" potential. When the output of the FIG. 20 circuit switches from "L" to "H", the output level drops from the "L" level by "H"−"L" to reach 2"L"−"H"−2.2 V at its maximum in the transient state. On the other hand, when the base of transistor $Q_2$ is directly connected to an input signal and an "H" signal is inputted, the voltage at the emitter of transistor $Q_2$ changes to "H"−$V_{BE}$, and the collector-emitter voltage $V_{CB}$ of $Q_2$ becomes $V_{CE}=$"L"−("H"−$V_{BE}$) which is about 0.1 V (transiently, 2"L"−"H"−("H"−$V_{BE}$) ≈ −0.6 V), so that $Q_2$ saturates. Therefore, it is preferable to shift the level of the input signal to prevent transistor $Q_2$ from saturating. When the level shifting circuit is used, the emitter potential of $Q_2$ is "H"−2 $V_{BE}$ even at the high level, and $V_{CE}=$"L"−("H"−2 $V_{BE}$)=0.9 V (transiently, 2"L"−"H"−("H"−2 $V_{BE}$)≈0.2 V), with the result that $Q_2$ will not be saturated. Here, the logical threshold value supplied to the base of the transistor $Q_1$ is not $V_{BB1}$, but $V_{BB2}$ which is lower than $V_{BB1}$ by $V_{BE}$.

FIGS. 21 to 27 show examples of APD circuits used in circuits which provide a non-inverted output signal. With the exception of FIG. 27, it is preferred that a level shifting circuit be incorporated into each of these circuits.

In the embodiment of the present invention illustrated by FIG., 21, two differential logic stages are provided ($Q_1$ and $Q_2$, and $Q_{24}$ and $Q_{25}$). An OR gate composed of n input transistors $Q_{26-1}$ to $Q_{26-n}$ whose collectors are grounded and whose emitters are connected in common to the base of transistor $Q_2$. A second OR gate is composed m transistors $Q_{27-1}$ to $Q_{27-m}$ whose collectors are grounded and whose emitters are connected in common to the base of the transistor $Q_{25}$ via a level shifting transistor $Q_{37}$. In this way, a multi-input OR-NAND gate for obtaining an AND of an n-input OR and an m-input OR can be constructed.

Figure 22:
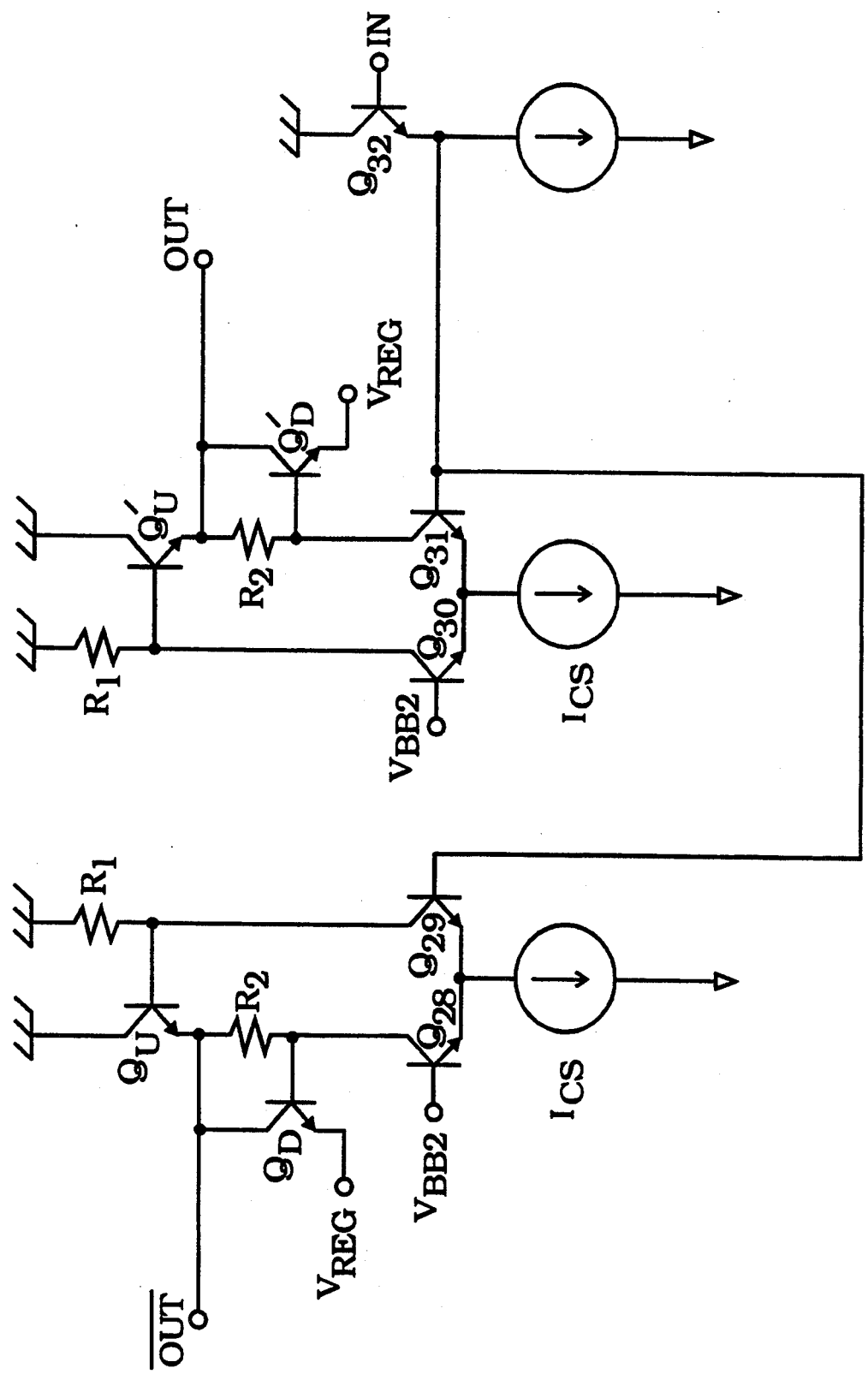
FIG. 22 is a circuit diagram showing an example of a complementary output gate, to which the embodiment of an APD circuit shown in FIG. 4 is applied.

In FIG. 22, an APD circuit is shown which functions as an inverter gate and which provides both a non-inverted and an inverted output simultaneously. The circuit is composed of a first differential logic stage composed of two emitter-connected transistors $Q_{28}$ and $Q_{29}$ and a second differential logic stage composed of two emitter-coupled transistors $Q_{30}$ and $Q_{31}$. The bases of the transistors $Q_{29}$ and $Q_{31}$ are connected in common to the emitter of an input transistor $Q_{32}$. Transistors $Q_u$ and $Q_D$ are provided on the side of $Q_{28}$ in the first differential logic stage to obtain an inverted output, and a second set of transistors $Q_{u'}$ and $Q_D'$ are provided in the second differential logic stage to obtain a non-inverted output.

Figure 23:
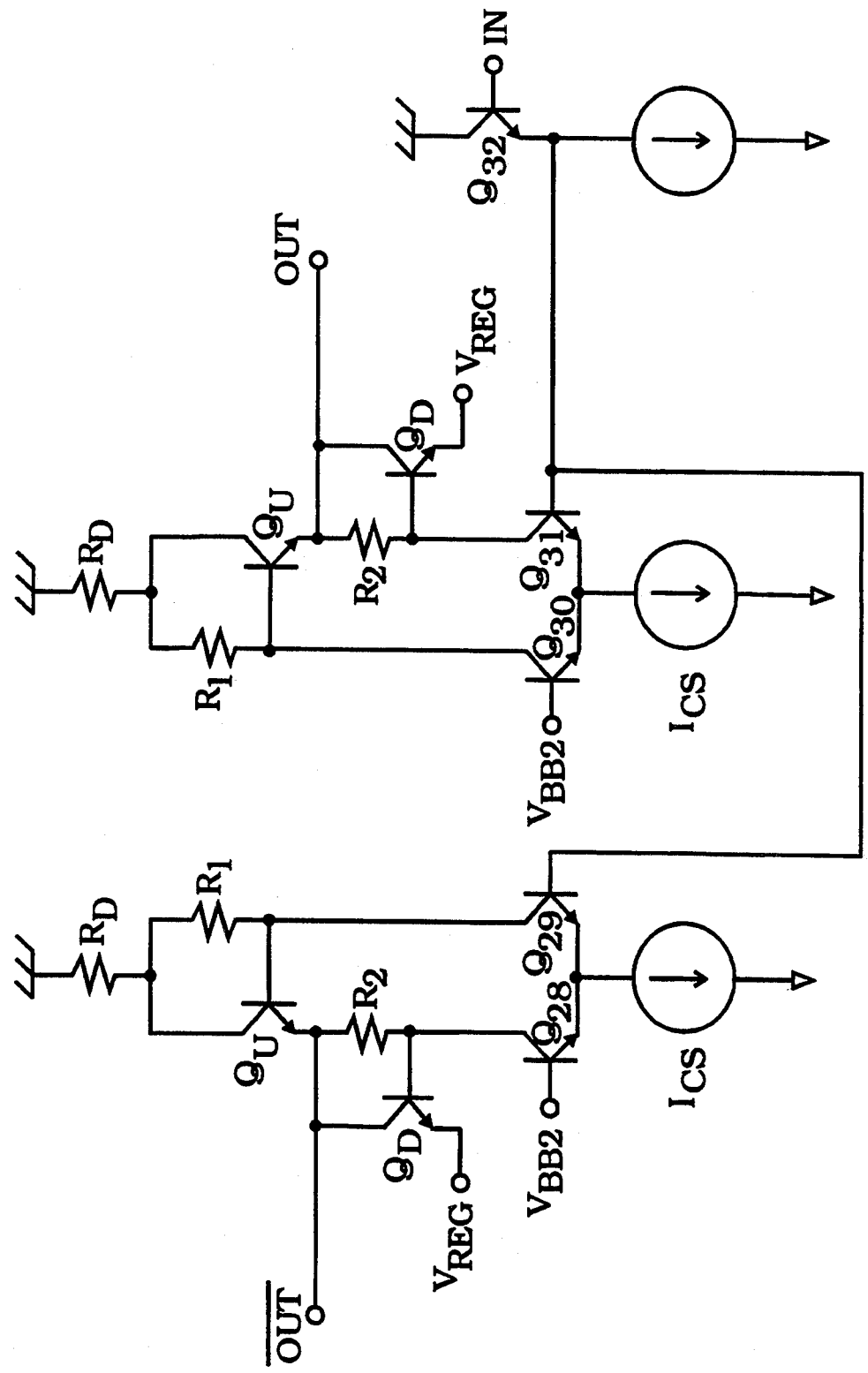
FIG. 23 is a circuit diagram showing an example of a single-ended input and differential output gate, to which the embodiment of an APD circuit shown in FIG. 4 is applied.
Figure 24:
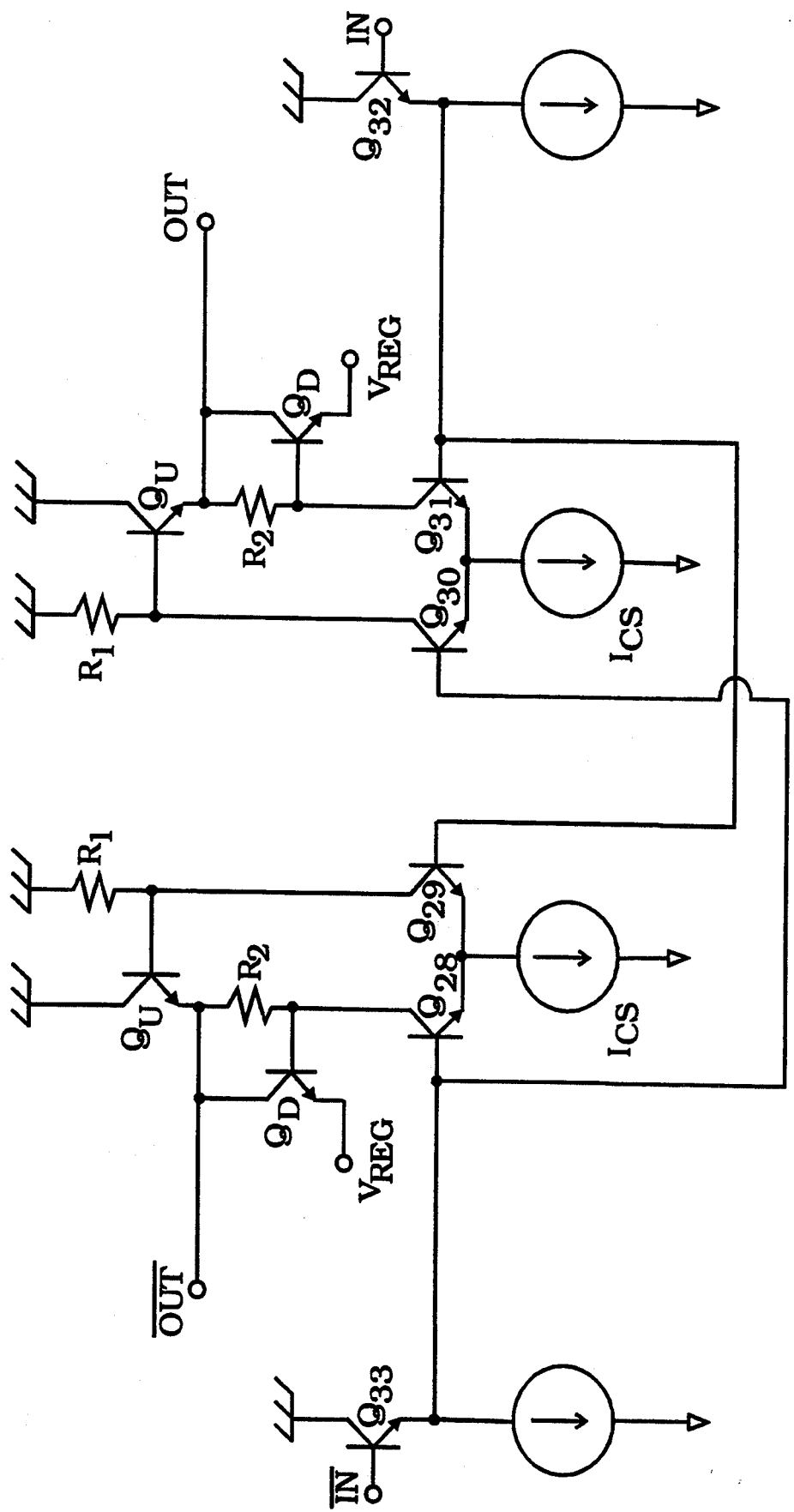
FIG. 24 is a circuit diagram showing an example of a differential input and complementary output gate, to which the embodiment of an APD circuit shown in FIG. 4 is applied.
Figure 25:
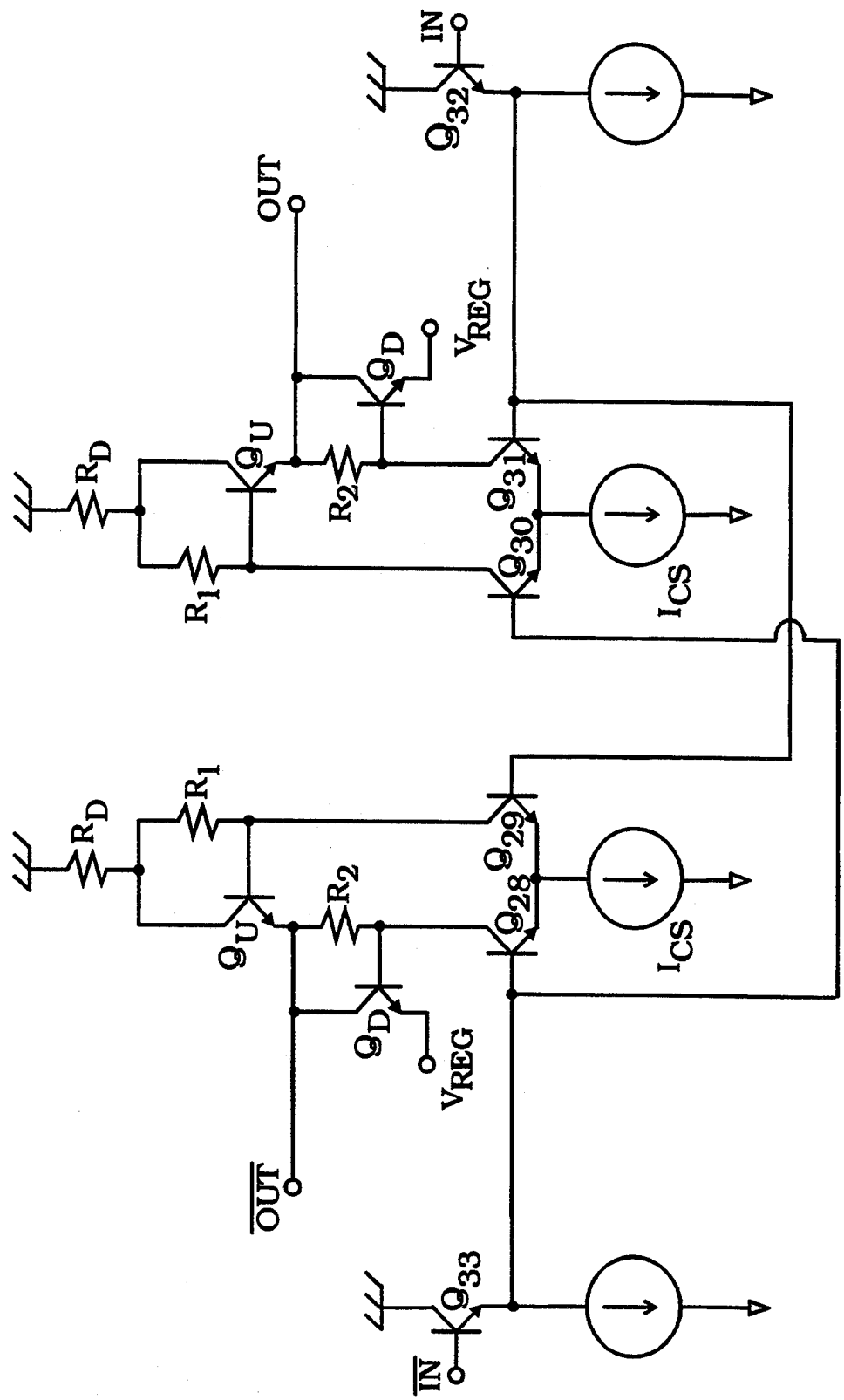
FIG. 25 is a circuit diagram showing an example of a differential input and differential output gate, to which the embodiment of an APD circuit shown in FIG. 4 is applied.
Figure 26:
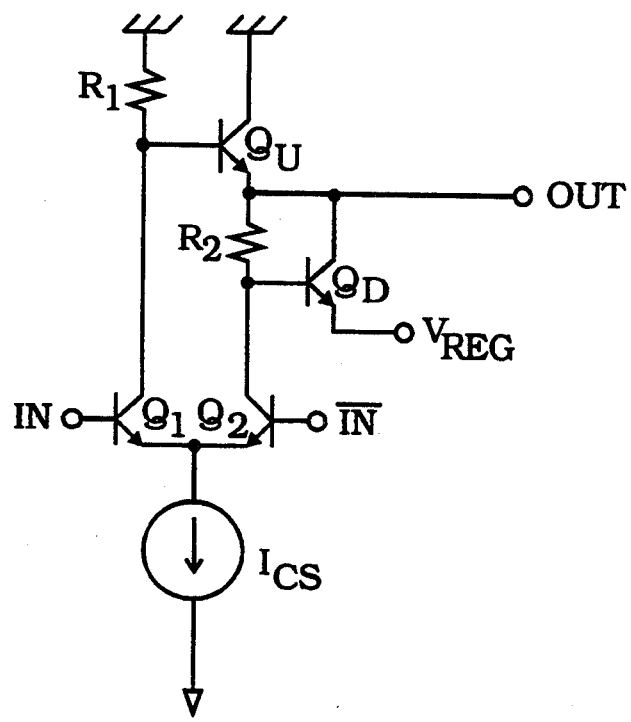
FIG. 26 is a circuit diagram showing an example of a differential input and single-ended inversion output gate, to which the embodiment of an APD circuit shown in FIG. 4 is applied.
Figure 27:
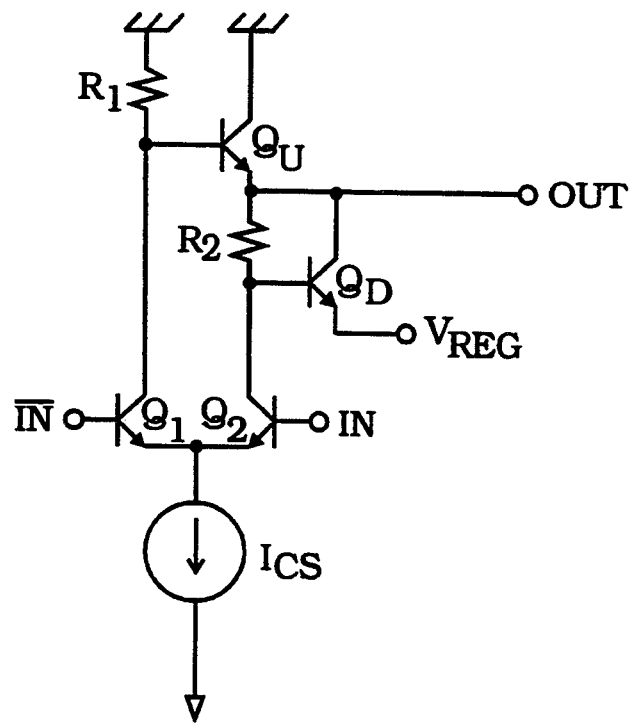
FIG. 27 is a circuit diagram showing an example of a differential input and single-ended non-inversion output gate, to which the embodiment of an APD circuit shown in FIG. 4 is applied.

FIGS. 23–27 illustrate APD circuits which use differential inputs. FIG. 23 shows an embodiment of the present invention in which two differential logic stages are coupled to ground via transistors $Q_u$ (whose base and collector are coupled via the resistor $R_1$) and resistors $R_D$, so as to construct a circuit having a single-ended input and a differential output. FIG. 24 shows an embodiment of an APD circuit which provides a differential input and a complementary output. The bases of the transistors $Q_{28}$ and $Q_{30}$ are connected in common to the emitter of a first (inverting) input transistor $Q_{33}$ and the bases of the transistors $Q_{29}$ and $Q_{31}$ are connected in common to the emitter of a second (non-inverting) input transistor $Q_{32}$. FIG. 25 shows an embodiment of the present invention which provides a gate circuit having differential input and differential output. FIGS. 26 and 27 show APD circuits which use differential inputs to provide single-ended inverted and non-inverted outputs, respectively.

The operation of the differential APD circuits illustrated in FIGS. 23–27 will be described generally. For differential signals, the amplitude of an inverted input changes in the opposite phase direction as does a non-inverted input. Therefore, the amplitude of the differential signal can be reduced to one half of that for a single-ended signal. In this case, two values of the differential signal can be selected between the "H" level and the "L" level: one is located between the "H" level and the $V_{BB1}$ level at ("H"+"L")/2; and the other is between the $V_{BB1}$ level and the "L" level. In preferred embodiments of an APD circuit in accordance with the present invention, the latter value is used. The reason for this preference is as follows: If the former value is selected, the $V_{REG}$ level must be set to ($V_{BB1}-V_{BB}$) rather than to ("L"$-V_{BE}$), so that when both the differential and the inverted differential signals are desired, two different $V_{REG}$ levels are required —one for each of the APD gates used in such a circuit. This is not convenient. By contrast, the differential signal value between the $V_{BB1}$ level and the "L" level is convenient to implement, since the $V_{REG}$ level used for each gate would be at "L"$-V_{BE}$. In addition, in the case of the latter value, since the higher level is the $V_{BB1}$ level, it is unnecessary to shift the level of the input signal, even for a circuit with a non-inverting output such as that shown in FIG. 27.

Figure 28:
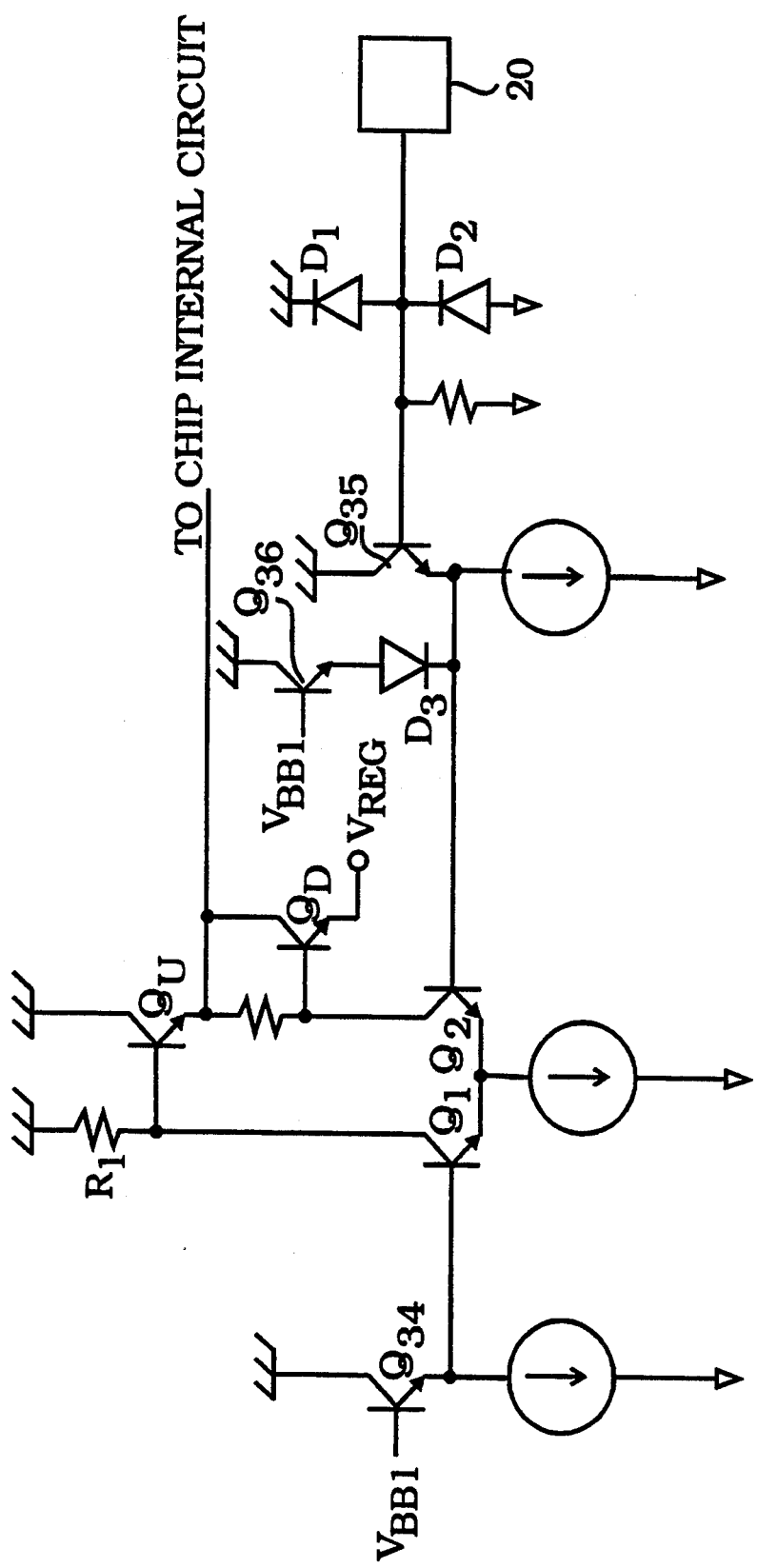
FIG. 28 is a circuit diagram showing an example of an input buffer circuit, to which the embodiment of an APD circuit shown in FIG. 4 is applied.

FIG. 28 shows an embodiment of the present invention implemented as an input buffer circuit. In this circuit, voltage $V_{BB1}$ is applied to the base of transistor $Q_{34}$ and the emitter of $Q_{34}$ is connected to the base of transistor $Q_1$ within the differential logic stage. A constant current source is also connected to the emitter of $Q_{34}$. Transistor $Q_{35}$ has its collector grounded and its base connected to an input pad 20. The base of transistor $Q_2$ is connected to the base of $Q_{35}$ and to a constant current source. Further, an output node of this APD circuit connects to an internal circuit of the chip. To stabilize the pad potential when the pad is left open, the pad node is pulled down to the supply potential. Diodes $D_1$ and $D_2$ couple the pad to both the supply voltage and to ground to protect the input buffer circuit against electrostatic discharge. Furthermore, the emitter of a collector-grounded transistor $Q_{36}$ having the base to which a reference potential $V_{BB1}$ is applied is connected to the base of the transistor $Q_2$ via a diode $D_3$.

An embodiment of the present invention applied to an output buffer circuit will be described hereinbelow.

Figure 29:
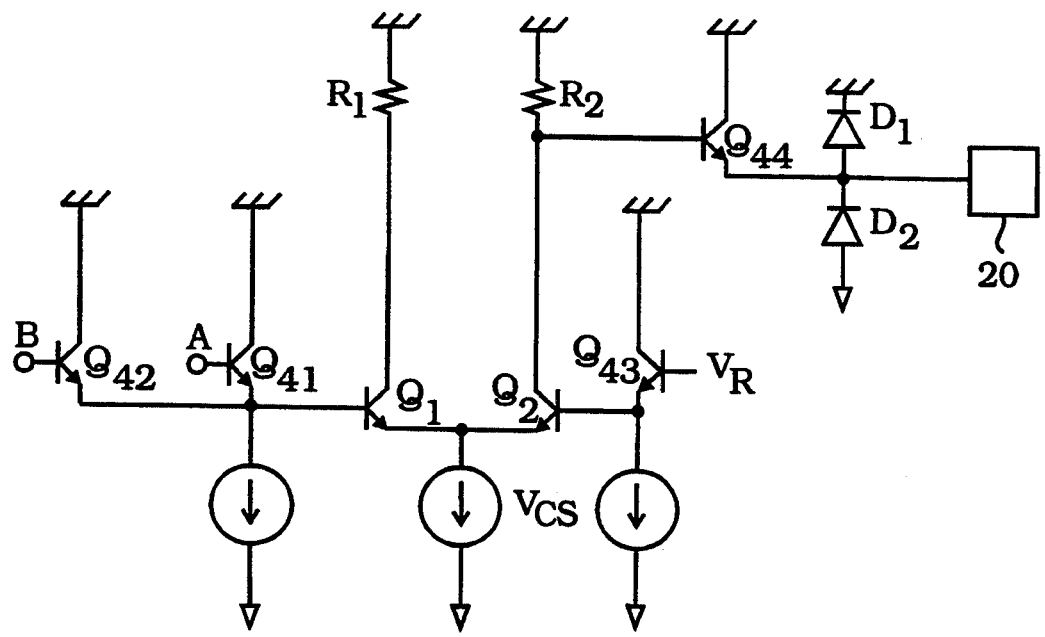
FIG. 29 is a circuit diagram showing a prior art 10 KH output buffer circuit.
Figure 30:
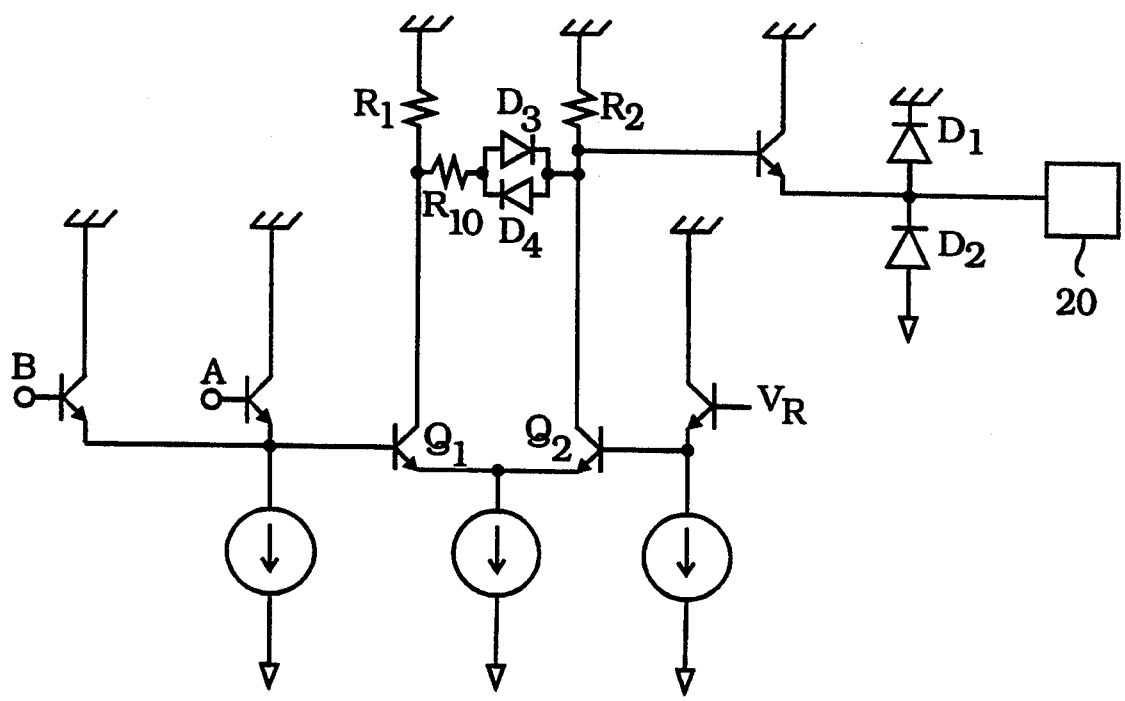
FIG. 30 is a circuit diagram showing a prior art 100K output buffer circuit.

Buffer circuits, such as the 10 KH standard ECL output circuit shown in FIG. 29 and the 100K standard ECL output circuit shown in FIG. 30 are conventionally known. In the case of the 10 KH standard circuit, the voltage $V_{CS}$ which is supplied to the current source is compensated such that the voltage difference between $V_{CS}$ and $V_{BE}$ is kept constant. For the 100K standard circuit, the voltage $V_{CS}$ is compensated as mentioned above even if the temperature changes. In FIG. 30, two diodes $D_3$ and $D_4$ connected in parallel and in opposite directions with respect to each other are connected in series with a resistor $R_{10}$ between the collectors of transistors $Q_1$ and $Q_2$ constituting the differential logic stage. The $D_3$, $D_4$ and $R_{10}$ circuit is used to compensate the output level of the FIG. 30 circuit.

Figure 31:
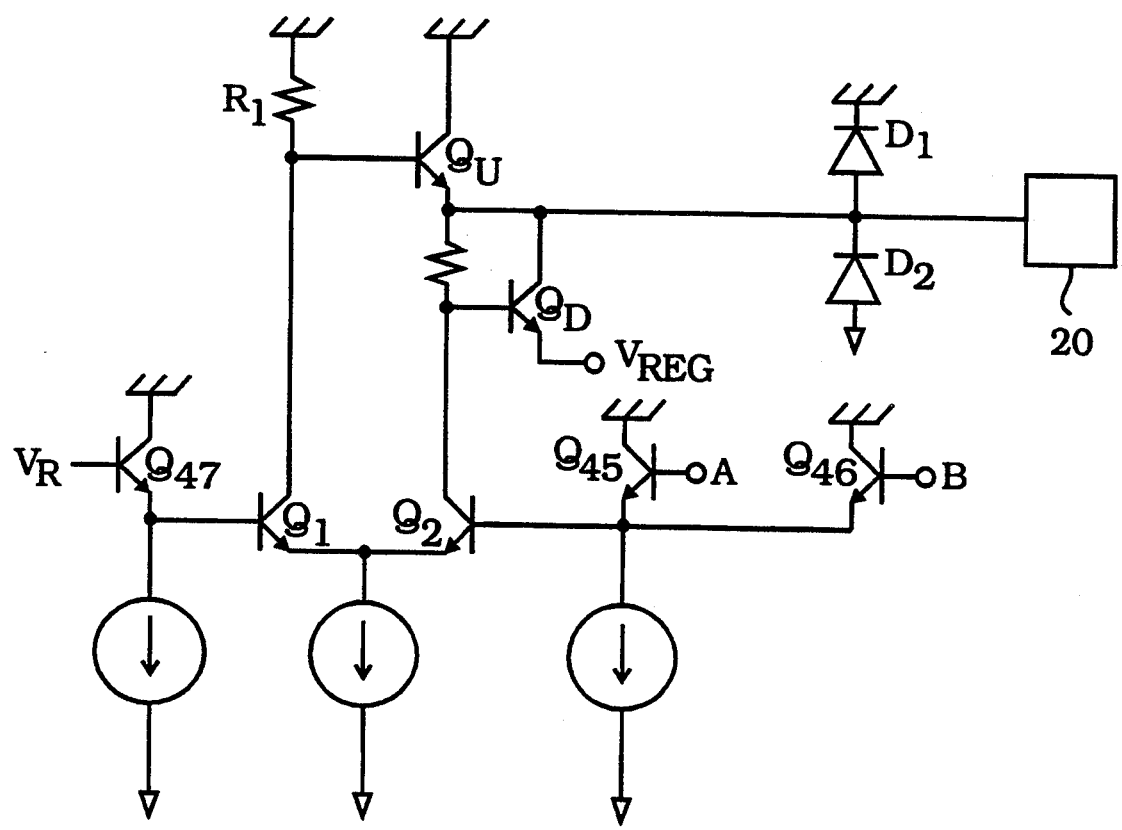
FIG. 31 is a circuit diagram showing a 10 KH output buffer circuit, to which the embodiment of an APD circuit shown in FIG. 4 is applied.
Figure 32:
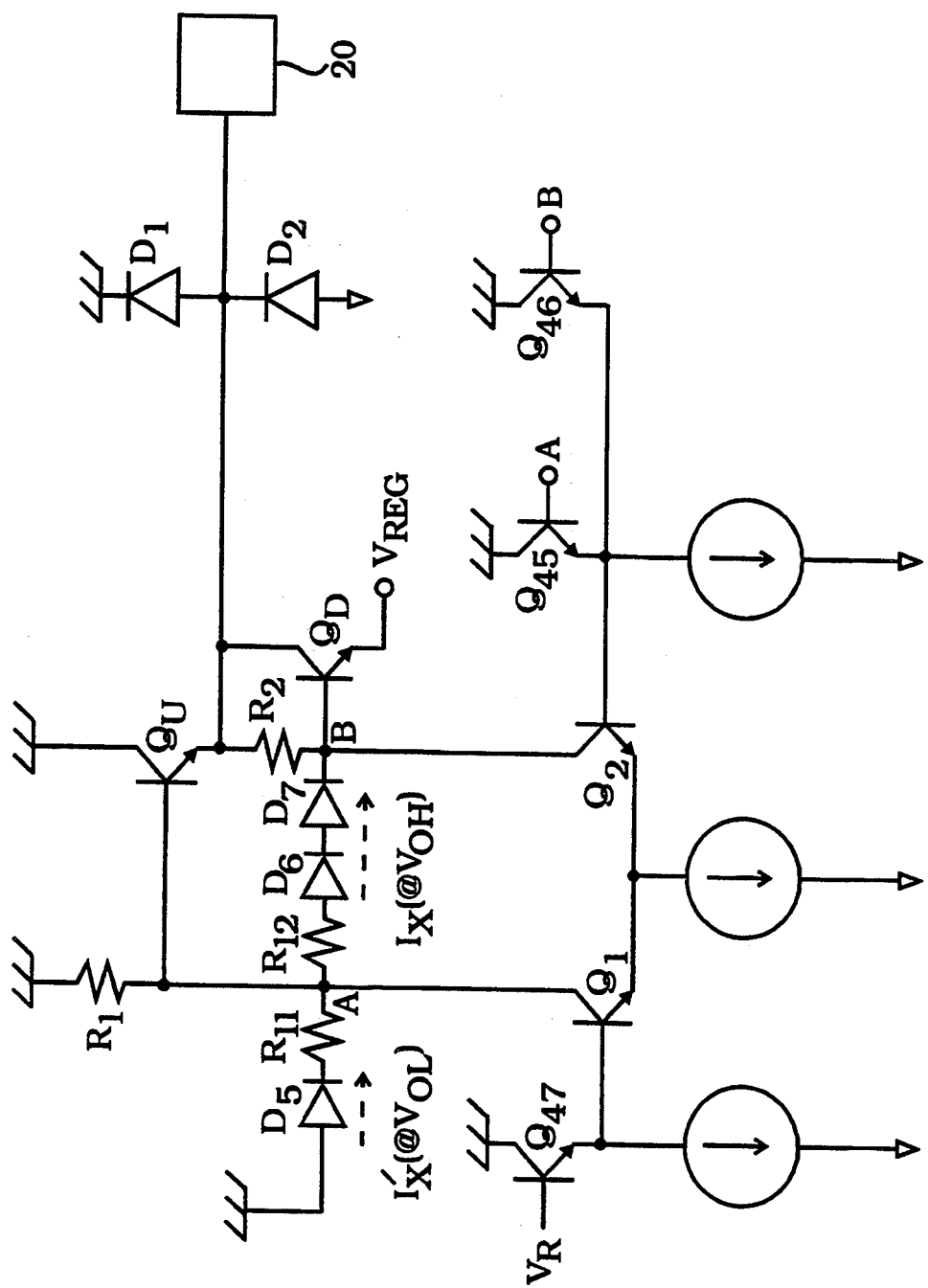
FIG. 32 is a circuit diagram showing a 100K output buffer circuit, to which the embodiment of an APD circuit shown in FIG. 4 is applied.

FIG. 31 is a 10 KH output buffer circuit which has been modified in accordance with the present invention. FIG. 32 is a 100K output buffer circuit which has been modified in accordance with the present invention. As shown in FIG. 32, to effect The 100K temperature compensation, the collector of transistor $Q_1$ is grounded via a diode $D_5$ connected in series with resistor $R_{11}$, and a resistor $R_{12}$ and diodes $D_6$ and $D_7$ are connected in series between the collectors of $Q_1$ and $Q_2$, preferably choosing $R_{11}=R_{12}=R_1=R_2$.

The operation of the temperature compensation circuit shown in FIG.. 32 will now be described. When the output is at the "H" level, the potential at node A is 0 V and the potential at node B is "L"$=-1.5$ V. If the temperature compensation circuit composed of $R_{12}$, $D_6$ and $D_7$ were not used, the temperature coefficient for the $V_{BE}$ of transistor $Q_u$ affects $V_{OH}$, causing $V_{OH}$ to rise with increasing temperature. However, if the temperature compensation circuit of $R_{12}$, $D_6$ and $D_7$ is incorporated, the compensation current $I_x$ which flows from the resistor $R_1$ through the compensation circuit of $R_{12}$, $D_6$ and $D_7$ is similarly affected by the temperature coefficient for the $V_{BE}$ of $Q_u$, so that the potential at the node A falls to compensate the $V_{OH}$.

When the output of the FIG. 32 circuit is at "L", the potential at node A is $-0.7$ V, and the potential at node B is "L"$=-1.5$ V, so that no current flows through the compensation circuit of $R_{12}$, $D_6$ and $D_7$. Without the compensation circuit of $D_5$ and $R_{11}$, $V_{OL}$ falls with increasing temperature due to the temperature dependence of the constant current source and the $V_{BE}$ of transistor $Q_u$. With the compensation circuit of $D_5$ and $R_{11}$, however, the compensation current $I_x'$ increases, which makes the current flowing through resistor $R_1$ to node A decrease, and makes the potential at node A increase, thus resulting in $V_{OL}$ compensation.

Figure 33:
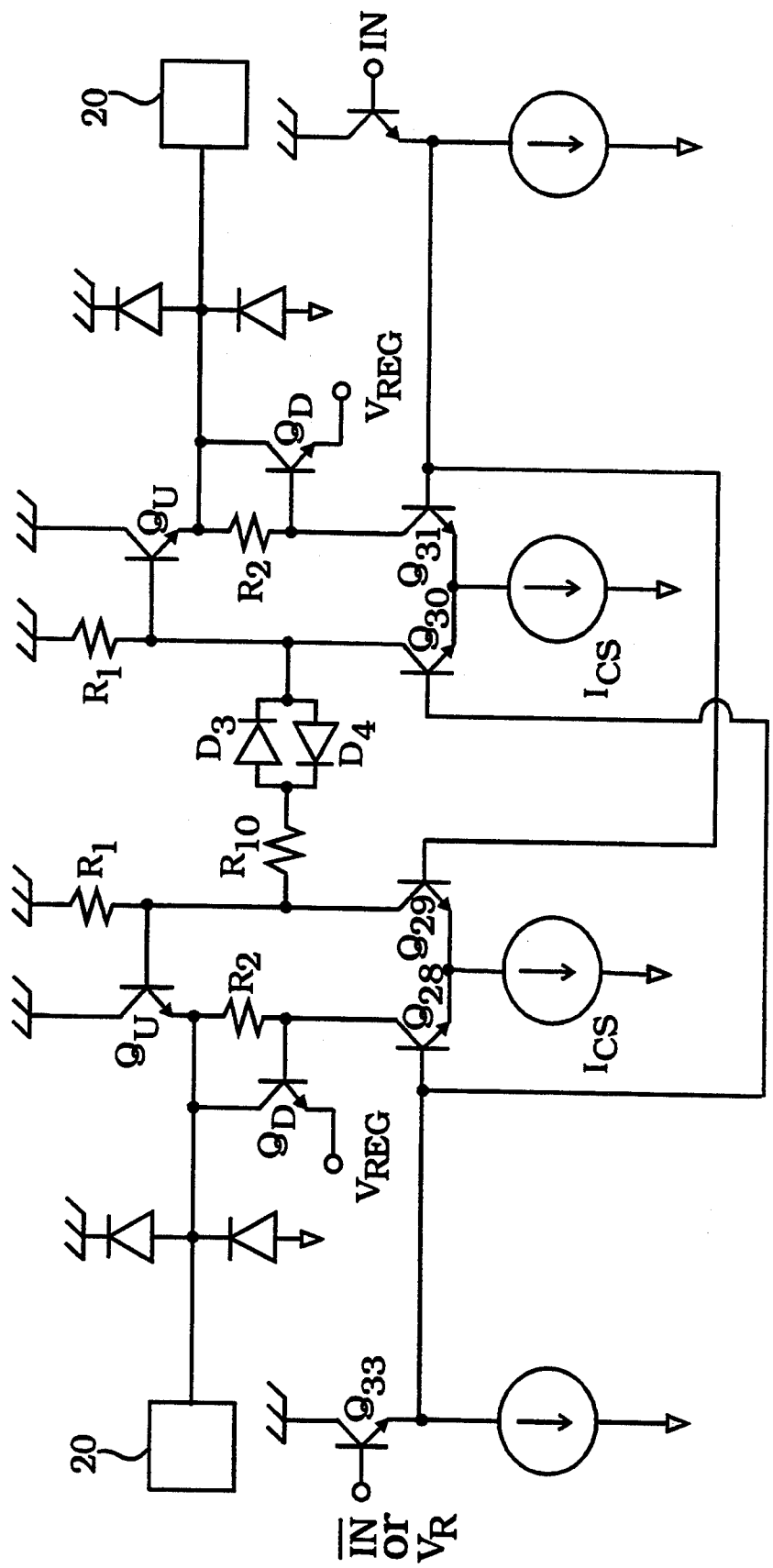
FIG. 33 is a circuit diagram showing a 100K output circuit buffer of complementary (or differential) output type, to which the embodiment of an APD circuit shown in FIG. 4 is applied.

FIG. 33 is an embodiment in which the 100 K standard compensation circuit as shown in FIG. 30 is modified in accordance with the present invention to form an output buffer circuit of complementary (or differential) output type similar to that shown in FIG. 24. In the drawing, the temperature compensation circuit is connected between the output nodes of the differential logic stage. In this case, although the temperature compensation circuit as shown in FIG. 32 can be used, the simple temperature compensation circuit of FIG. 30 is shown. The FIG. 30 compensation circuit composed of a resistor $R_{10}$ in series with two diodes $D_3$ and $D_4$ connects the collectors of the two transistors which make up the differential stage.

Figure 3:
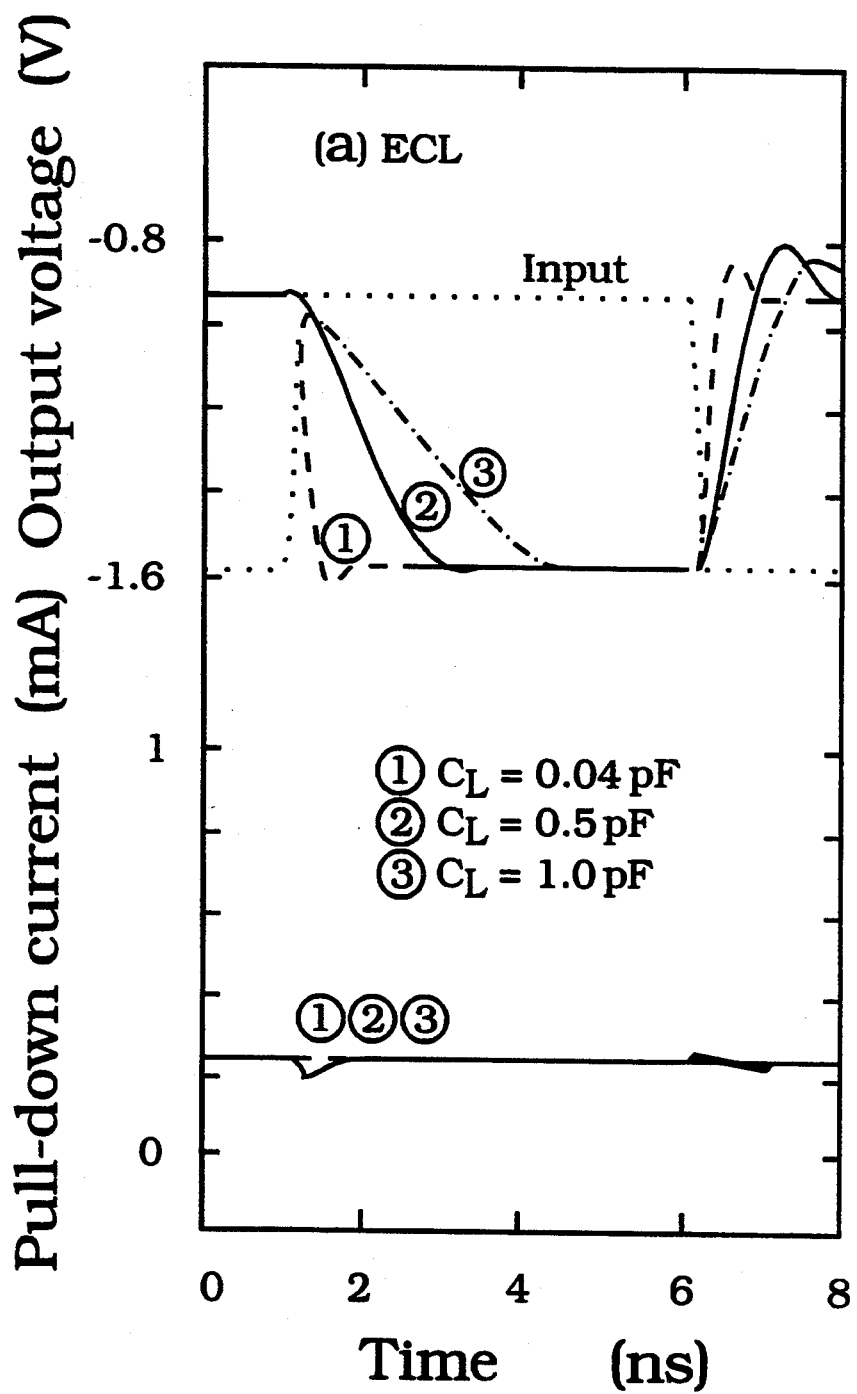
FIG. 3 is a graph showing the results of simulations for the operating voltage and discharge current of the prior art ECL inverter circuit in FIG. 2, in which $I_{CS}=I_{EF}=235$ $\mu$A.
Figure 34:
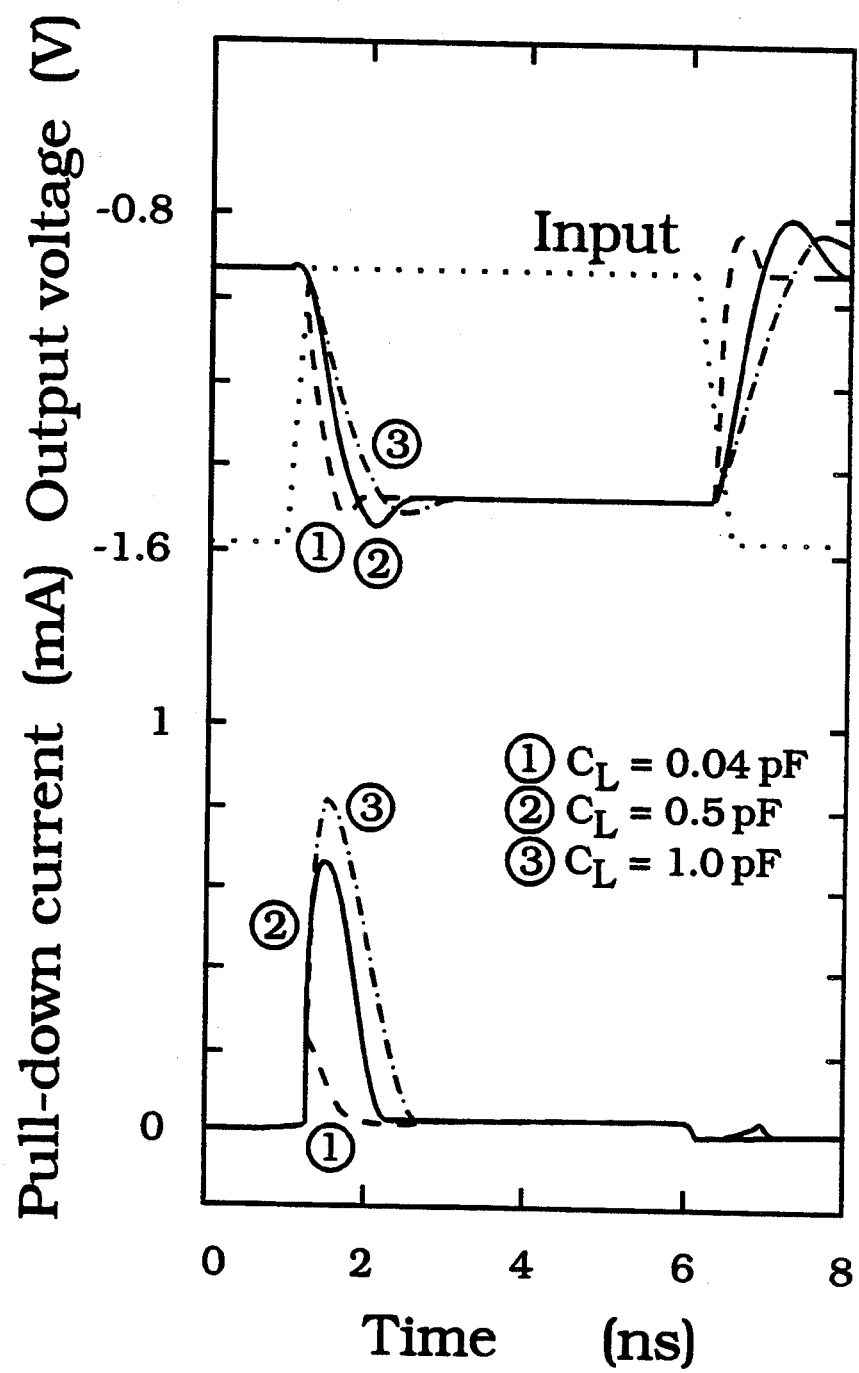
FIG. 34 is a graph showing simulation results for the operating output voltage and the discharging current of an inverter gate formed in accordance with the present invention shown in FIG. 12, in which $I_{CS} = 235$ μA.
Figure 35:
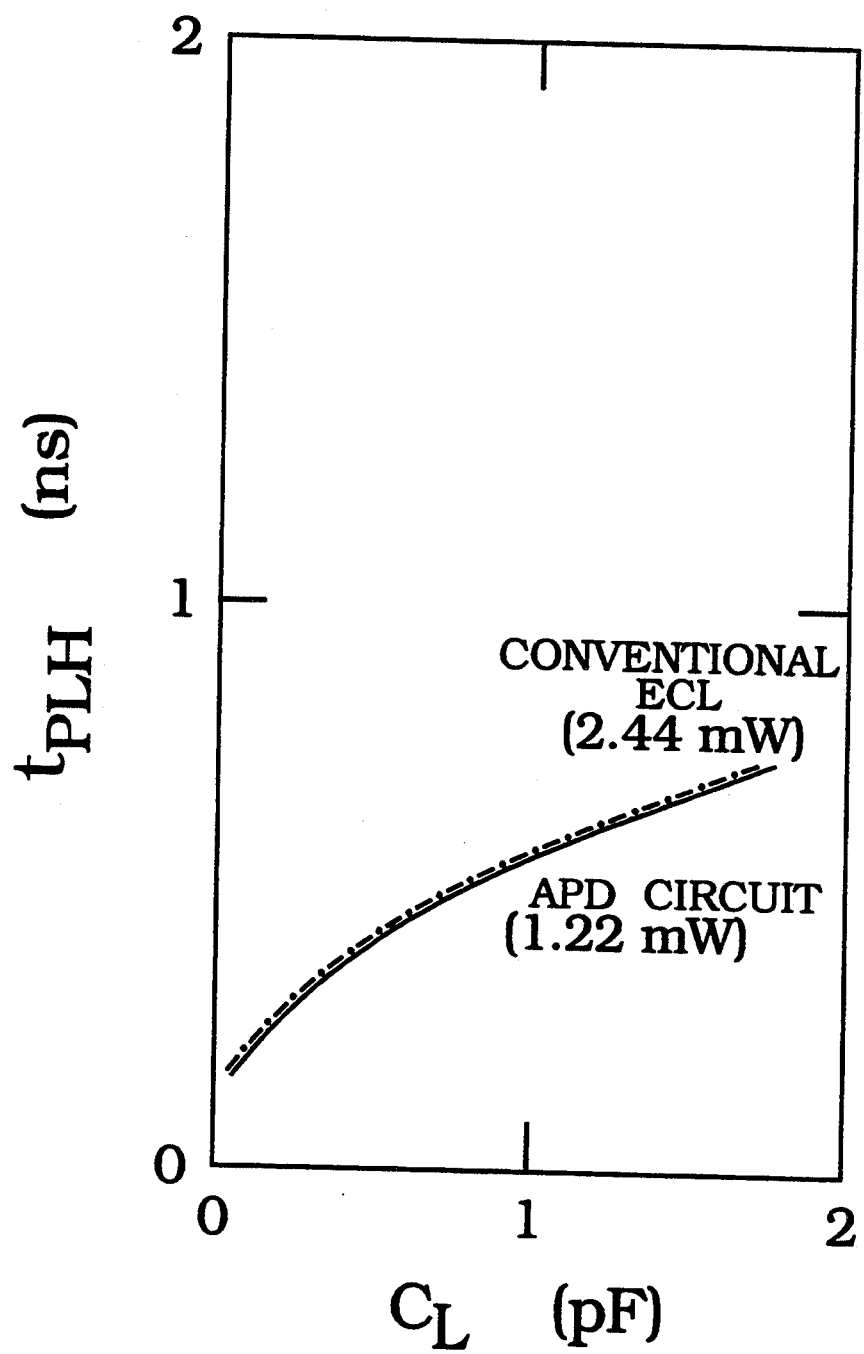
FIG. 35 is a graph showing the operating speed characteristics for different load capacitances for both an inverter gate in accordance with the present invention and the prior art ECL inverter circuit, both graphs showing the switch from a low level to a high level in response to a decrease in the input voltage level.
Figure 36:
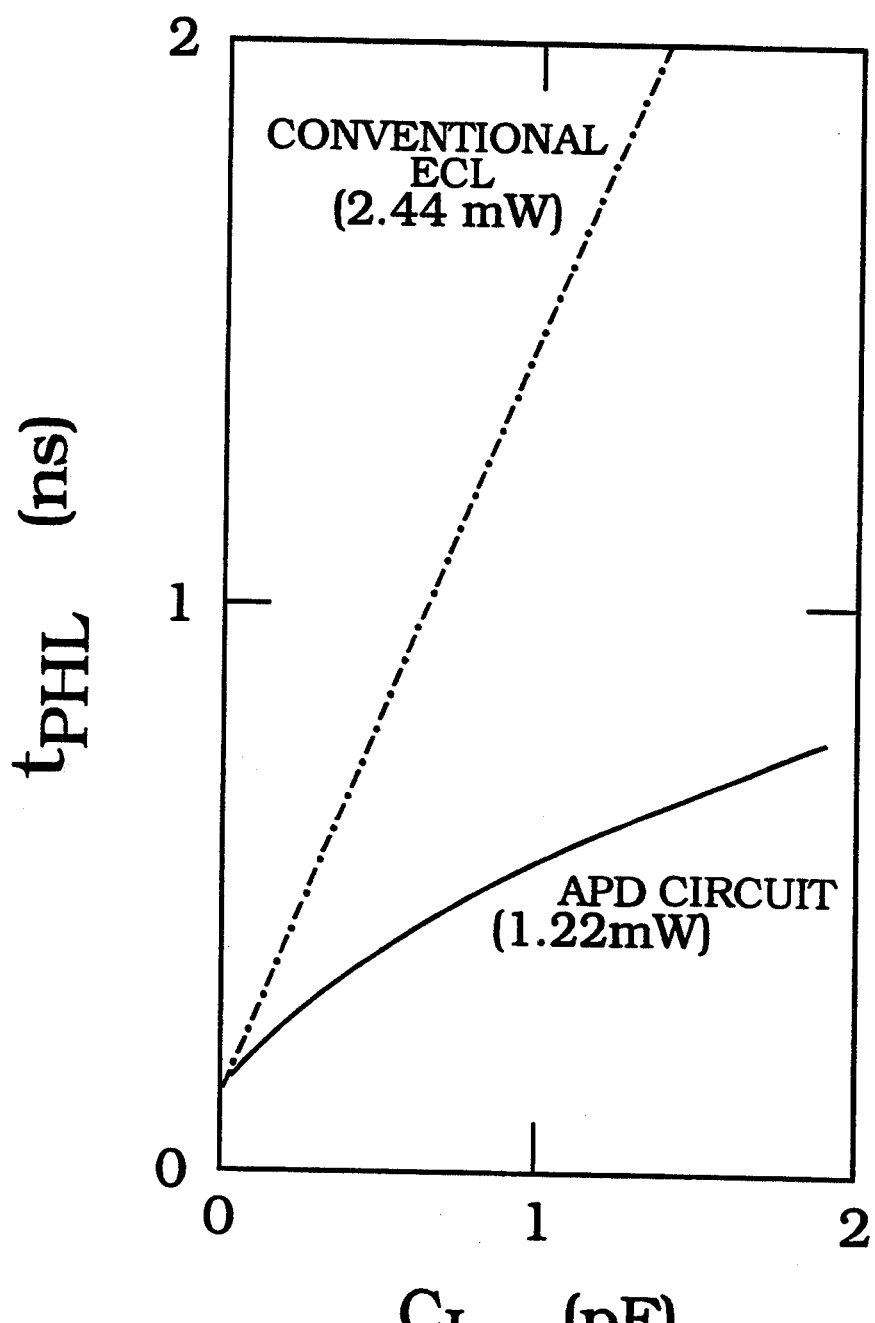
FIG. 36 is a graph showing the operating speed characteristics for different load capacitances for both an inverter gate in accordance with the present invention and the prior art ECL inverter circuit, both graphs showing the switch from a high level to a low level in response to an increased input voltage level.

By using the present invention, it is possible to improve various characteristics of logic circuits. For instance, FIG. 34 shows the transient discharging current obtained when an inverter gate in accordance with the present invention is switched. In contrast with circuits analyzed in the FIG. 3 simulations, it is apparent that a large transient discharging current flows only during the switching operation. Further, it is apparent that only the necessary transient discharging current is supplied according to the magnitude of the load. Other advantages of the present invention are apparent. In the conventional circuit, the speed $t_{pHL}$ at which the output of the emitter-follower stage changes from the "H" level to the "L" level is slower than the speed $t_{pLH}$ for the opposite switching operation. In the present invention, however, it is possible to reduce the speed $t_{pHL}$ to such an extent as to be approximately equal to $t_{pLH}$, as shown in FIGS. 35 and 36.

Figure 37:
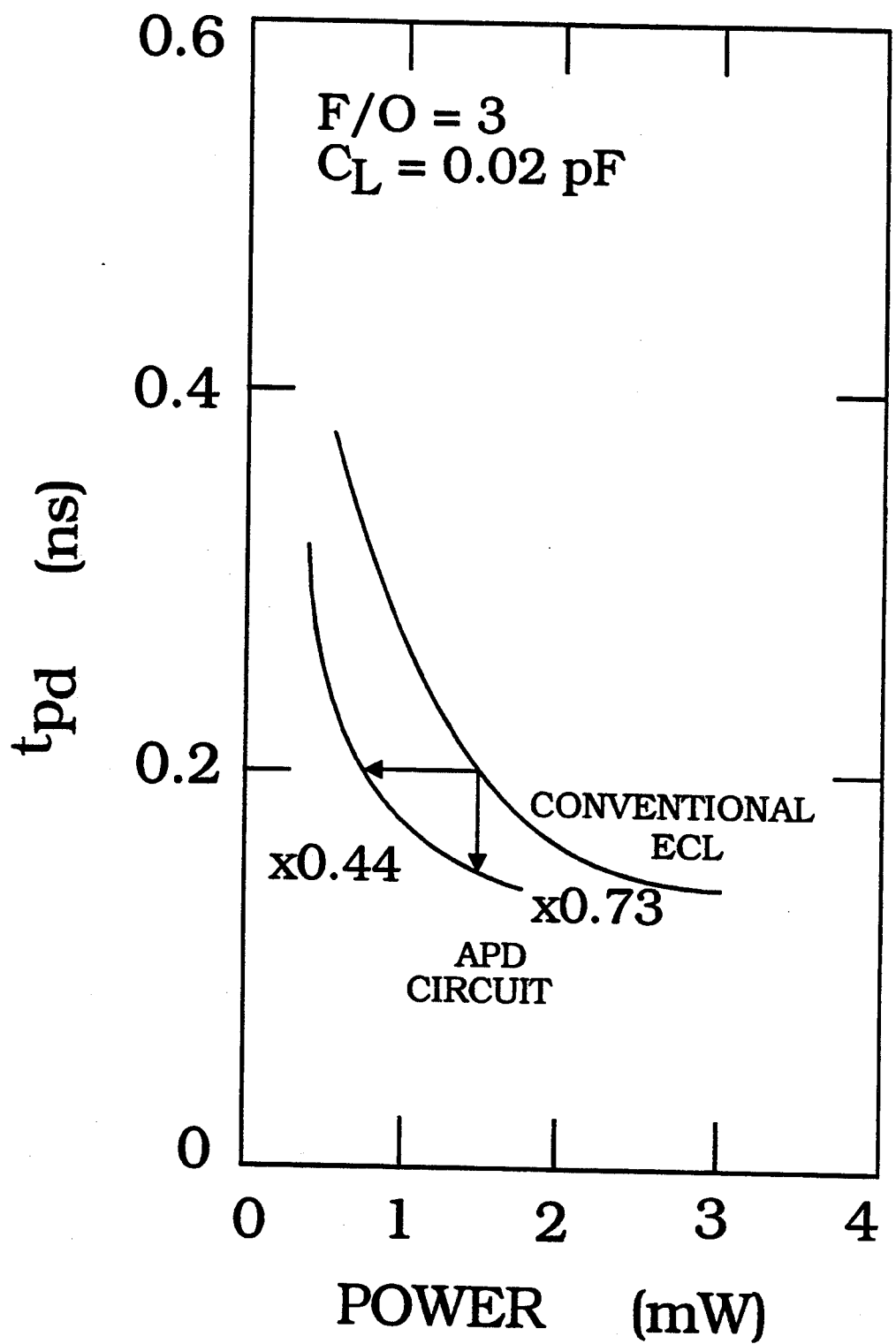
FIG. 37 is a graph showing the delay time and power consumption for both an inverter gate formed in accordance with the present invention and the prior art ECL gate.
Figure 38:
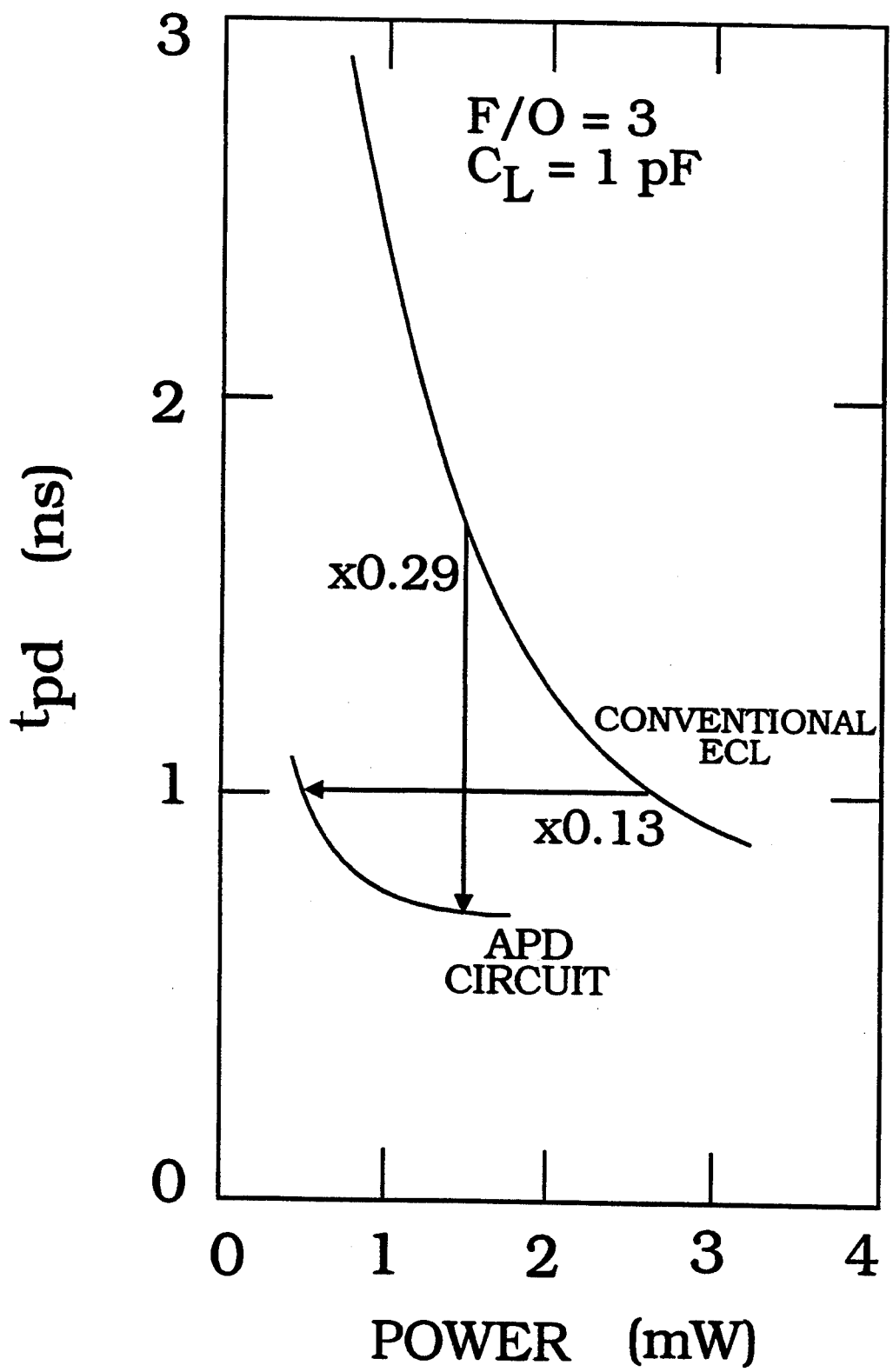
FIG. 38 is a graph showing the relationship between the delay time and power consumption for both an inverter gate formed in accordance with the present invention and the prior art ECL inverter circuit under different loading conditions from those shown in FIG. 37.
Figure 39:
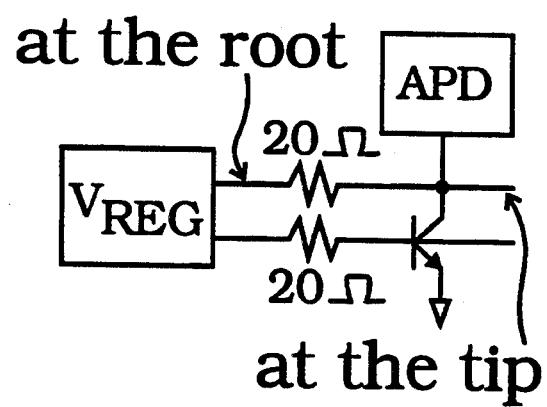
FIG. 39B is a graph showing the tracking errors of the actual $V_{REG}$ relative to the reference potential $(V_R)$ in the embodiment of the present invention shown in FIG. 16 for different numbers of APD circuits used as a load.
FIG. 39A illustrates an embodiment of the present invention in which the parasitic resistance of the $V_{REG}$ line is large.
Figure 39:
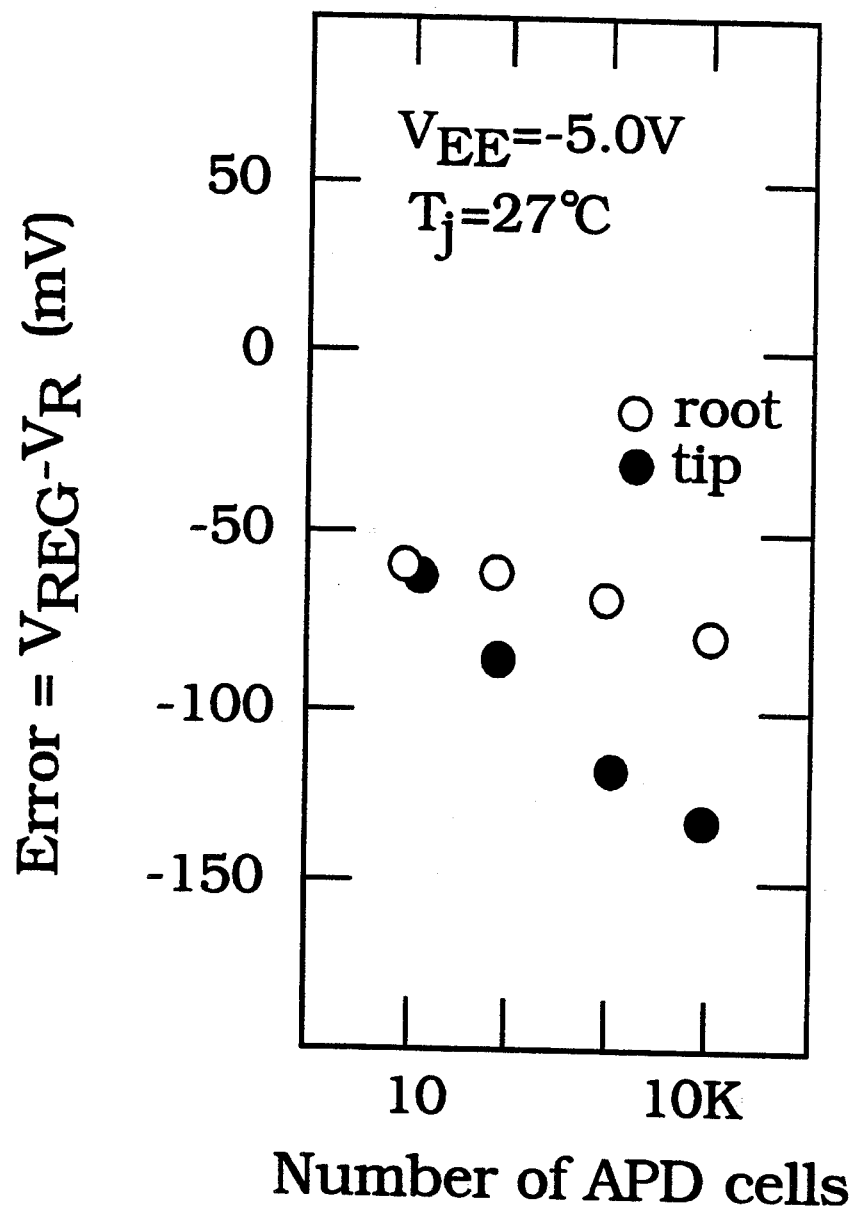
Figure 40:
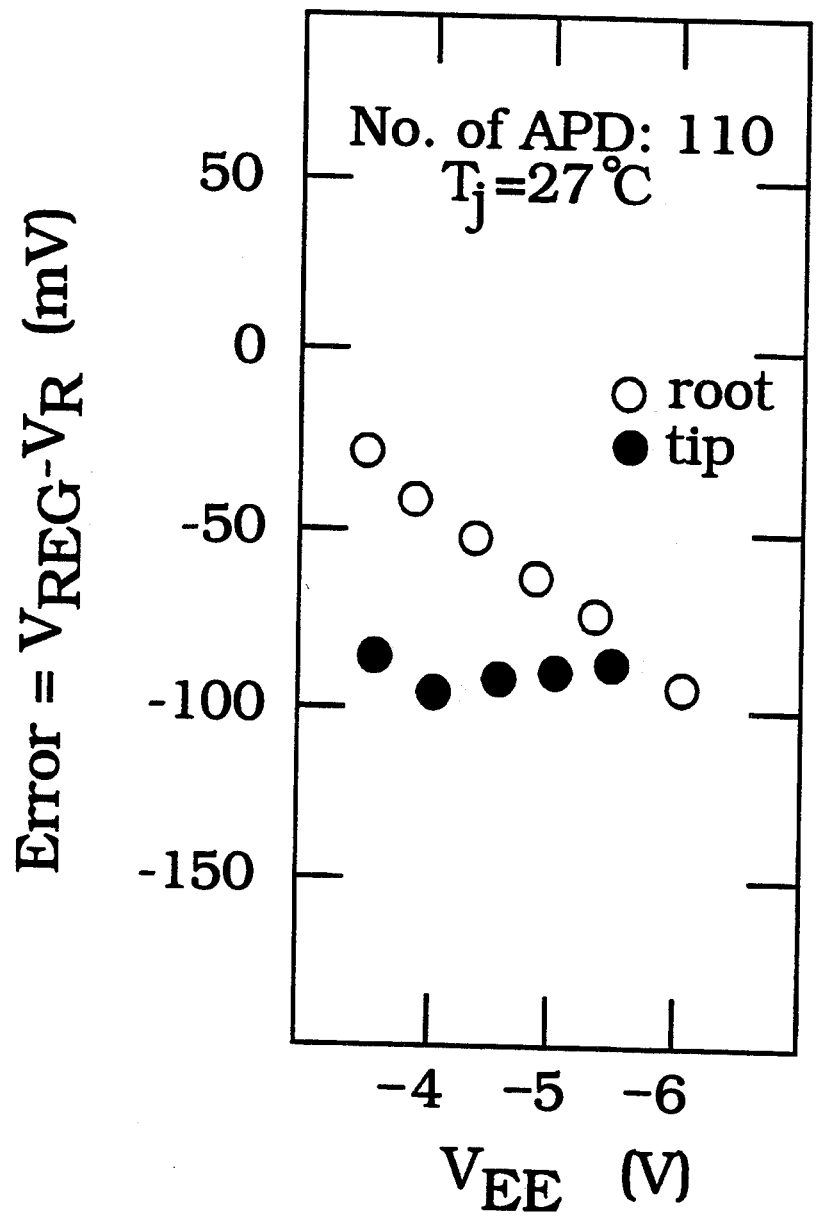
FIG. 40 is a graph showing the tracking errors of the actual $V_{REG}$ relative to the reference potential $(V_R)$ in the embodiment of the present invention shown in FIG. 16 for variations in the supply voltage $V_{EE}$.
Figure 41:
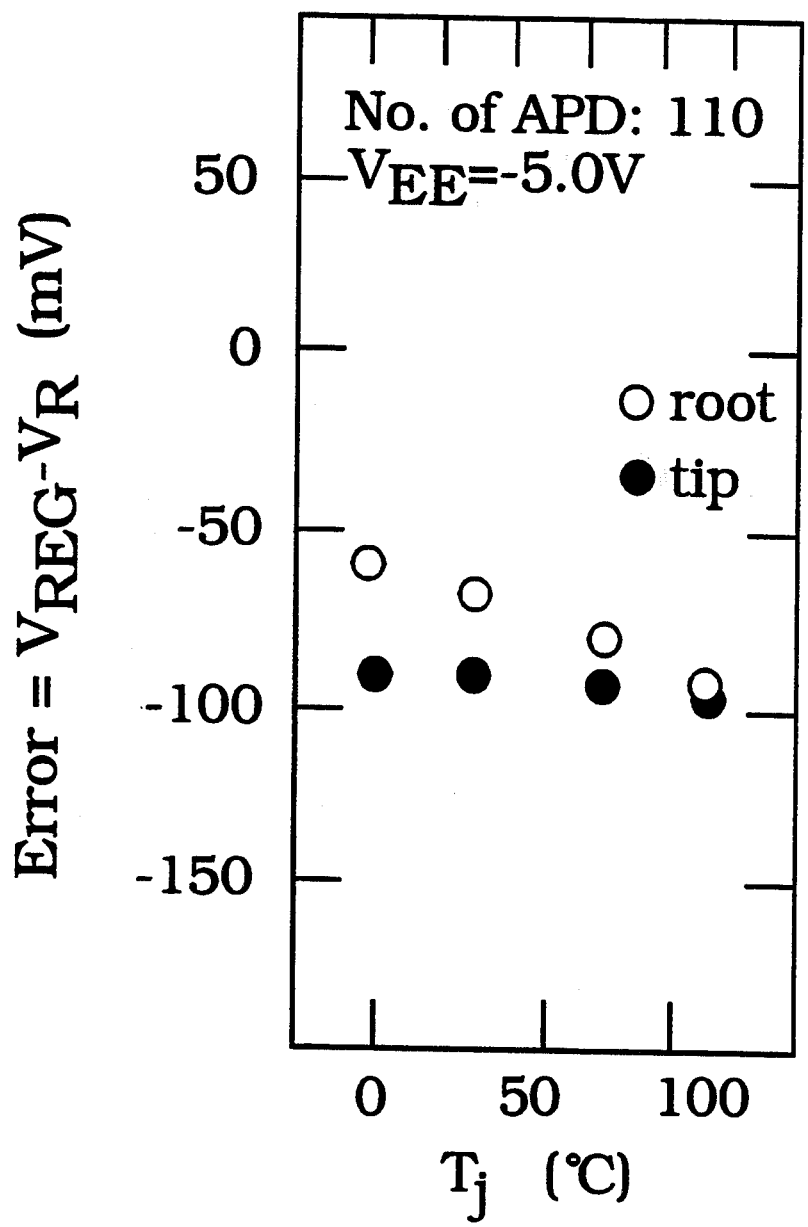
FIG. 41 is a graph showing the tracking errors of the actual $V_{REG}$ relative to the reference potential $(V_R)$ in the embodiment of the present invention shown in FIG. 16 for varying junction temperatures $T_j$.

As shown in FIGS. 37 and 38, it is possible to markedly improve the power consumption and the delay time with the present invention. For a fan out $F/O=3$ and $C_L=1$ pF, it is possible to reduce the delay time $t_{pd}=(t_{pLH}+t_{pHL})/2$ of the conventional ECL circuit of 1.75 ns down to 0.5 ns in the case of the present invention; that is, about 0.29 times shorter than the conventional value at the same power consumption of 1.4 mW. In other words, the delay time can be in,proved about 3.5 times. Further, in comparison with respect to the power consumption at the gate delay time of 1 ns, the value of 2.5 mW/gate for the conventional ECL circuits can be reduced to the value of 0.35 mW/gate for the respective circuits of the present invention; that is, the power consumption can be improved by about 7.1 times. FIG. 37 shows similar comparison results under the conditions that the fan out $F/O=3$, and $C_L=0.02$ pF, which indicates also the remarkable improvement effects.

Since the present invention can be realized using the same elements and the same number of elements as are used for conventional ECL circuits, it is possible to immediately realize the present invention with existing semiconductor manufacturing techniques and in existing products such as ECL gate array or other ASIC device.

In the embodiments of the present invention such as those shown in FIGS. 12 and 16, since an appropriate $V_{REG}$ is given, it is possible to set the $V_{REG}$ value properly at all times owing to the self-tracking function of the $V_{REG}$ of the operational amplifier, even if the number of APD circuits connected to $V_{REG}$ changes markedly or the supply voltage $V_{EE}$ or the temperature $T_j$ fluctuate violently, allowing stable operation.

Further, FIGS. 39A to 41 are graphs showing the effect of the $V_{REG}$ voltage supply in the embodiment shown in FIG. 16. These drawings indicate that the $V_{REG}$ can be controlled at the desired values within a very precise range (e.g., 0.15 V or less), even when the parasitic resistance of the $V_{REG}$ line is large (e.g., 20 Ω; see FIG. 39A) or when a number of APD circuits are switched simultaneously (e.g., max: 10,000 circuits, see FIG. 39B).

While the present invention has been described with reference to specific preferred embodiments thereof, it will be understood by those skilled in this art that various changes may be made without departing from the true spirit and scope of the invention. In addition, many modifications may be made to adapt the invention to a given situation without departing from its essential teachings.

What is claimed is:

1. An integrated circuit comprising:
   a first transistor and a second transistor, each of said transistors having an emitter, a base and a collector, wherein said emitter of said first transistor and said emitter of said second transistor are coupled together, and wherein said base of said first transistor comprises a first node, and wherein said base of said second transistor comprises a second node;
   a third transistor having an emitter, a base and a collector, wherein said base of said third transistor is coupled to said collector of said first transistor, and wherein said emitter of said third transistor comprises a third node characterized by a third node potential;
   a first resistive element, said first resistive element being coupled to said collector of said second transistor and to said emitter of said third transistor;
   a fourth transistor having an emitter, a base and a collector, wherein said emitter of said third transistor is coupled to said collector of said fourth transistor, and wherein said collector of said second transistor is coupled to said base of said fourth transistor;
   a first reference potential;
   a second resistive element coupled to said collector of said first transistor and to said first reference potential, wherein said collector of said third transistor is coupled to said first reference potential; and
   a constant voltage source, said constant voltage source generating a constant voltage signal, wherein said constant voltage source is coupled to said emitter of said fourth transistor, and wherein said constant voltage source is regulated such that the time required for said third node potential to switch from a first level to a second level is substantially equal to the time required for said third node potential to switch from said second level to said first level.

2. The circuit of claim 1 further comprising a second reference potential coupled to said base of said first transistor.

3. The circuit of claim 1 further comprising a second reference potential coupled to said base of said second transistor.

4. The circuit of claim 1 further comprising a current source coupled to said emitters of said first and second transistors.

5. The circuit of claim 4 further comprising a fifth transistor, wherein said emitters of said first and second transistors are coupled to said current source through said fifth transistor.

6. The circuit of claim 1 wherein said first reference potential is ground.

7. The circuit of claim 1 further comprising a third resistive element having a first terminal and a second terminal, wherein said first terminal of said third resistive element is connected to said first reference potential, and wherein said collector of said third transistor is coupled to said second terminal of said third resistive element, and wherein said second resistive element is connected to said second terminal of said third resistive element.

8. The circuit of claim 1 wherein said constant voltage source comprises:
- a reference potential generating circuit generating a second reference potential;
- an operational amplifier having a first input terminal and second input terminal, wherein said second reference potential is provided to said first input terminal, and said constant voltage signal is provided to said second input terminal of said operational amplifier, and wherein said operational amplifier generates a correction signal in response to said second reference potential and said constant voltage signal; and
- a constant voltage signal adjustment circuit coupled to said operational amplifier, said operational amplifier providing said correction signal to said constant voltage adjustment circuit, whereby said constant voltage signal adjustment circuit adjusts said constant voltage signal in response to said correction signal.

9. The circuit of claim 8 wherein said reference potential generating circuit comprises:
- a fifth transistor and a sixth transistor, each of said transistors having an emitter, a base and a collector, wherein said emitter of said fifth transistor and said emitter of said sixth transistor are coupled together;
- a seventh transistor having an emitter, a base and a collector, wherein said base of said seventh transistor is coupled to said collector of said fifth transistor, and wherein said collector of said seventh transistor is coupled to said first reference potential;
- a third resistive element, said third resistive element being coupled to said collector of said sixth transistor and to said emitter of said seventh transistor;
- a fourth resistive element having a first terminal and a second terminal, said first terminal of said fourth resistive element being coupled to said collector of said fifth transistor and to said base of said seventh transistor, and wherein said second terminal of said fourth resistive element is coupled to said first reference potential;
- a current source; and
- an eighth transistor having an emitter, a base and a collector, wherein said emitter of said seventh transistor is coupled to said collector of said eighth transistor, and wherein said collector of said sixth transistor is coupled to said base of said eighth transistor, wherein said emitter of said eighth transistor is coupled to said current source, and wherein said emitter of said eighth transistor generates said second reference potential.

10. The circuit of claim 8 wherein said reference potential generating circuit comprises:
- a third reference potential;
- a fifth transistor having an emitter, a base and a collector, wherein said third reference potential is provided to said base of said fifth transistor;
- a sixth transistor having an emitter, a base and a collector, wherein said collector of said fifth transistor is coupled to said base of said sixth transistor, and wherein said collector of said sixth transistor is coupled to said first reference potential;
- a third resistive element having a first end and a second end, wherein said emitter of said sixth transistor is coupled to said first end of said third resistive element;
- a fourth resistive element having a first terminal and a second terminal, said first terminal of said fourth resistive element being coupled to said collector of said fifth transistor and to said base of said sixth transistor, wherein said second terminal of said fourth resistive element is coupled to said first reference potential;
- a current source; and
- a seventh transistor having an emitter, a base and a collector, wherein said emitter of said sixth transistor is coupled to said collector of said seventh transistor, and wherein said base of said seventh transistor is coupled to said second end of said third resistive element, and wherein said emitter of said seventh transistor is coupled to said current source, and wherein said emitter of said seventh transistor provides said second reference potential.

11. The circuit of claim 8 wherein said constant voltage signal adjustment circuit comprises:
- a fifth transistor having an emitter, a base and a collector, wherein said operational amplifier provides said correction signal to said base of said fifth transistor causing said emitter of said fifth transistor to generate an emitter output signal;
- a current mirror circuit coupled to said emitter of said fifth transistor;
- a third resistive element coupled to said current mirror circuit, said current mirror circuit causing a current to flow through said third resistive element which is proportional to said emitter output signal; and
- a sixth transistor having an emitter, a base and a collector, wherein said collector of said sixth transistor is coupled to one end of said third resistive element, said one end being coupled to said current mirror circuit, and wherein said base of said sixth transistor is coupled to another end of said third resistive element, and wherein said another end is coupled to said constant voltage source.

12. The circuit of claim 11 wherein said current mirror circuit comprises:
- a seventh transistor having an emitter, a base and a collector, wherein said base of said seventh transistor is coupled to said collector of said seventh transistor;
- an eighth transistor having an emitter, a base and a collector, wherein said base of said eighth transistor is coupled to said base of said seventh transistor, and wherein said collector of said eighth transistor is coupled to said base of said sixth transistor; and
- a fourth resistive element coupled to said emitter of said fifth transistor and to said collector of said seventh transistor.

13. The circuit of claim 11 further comprising a capacitor, wherein said collector of said sixth transistor is coupled to ground through said capacitor.

14. The circuit of claim 11 further comprising:
- a ninth transistor having an emitter, a base and a collector, wherein said collector of said ninth transistor is coupled to said base of said ninth transistor, and wherein said collector of said ninth transistor is coupled to ground; and a fourth resistive element, wherein said collector of said sixth transistor is coupled to one end of said fourth resistive element, and wherein said emitter of said ninth transistor is coupled to another end of said fourth resistive element.

15. The circuit of claim 11 further comprising:
a constant voltage signal line coupled to said base of said sixth transistor; and
a seventh transistor having an emitter, a base and a collector, wherein said collector of said seventh transistor is coupled to said emitter of said fourth transistor, and wherein said base of said seventh transistor is coupled to said constant voltage signal line.

16. The circuit of claim 15 further comprising a capacitor, wherein one terminal of said capacitor is coupled to said base of said seventh transistor and another terminal of said capacitor is coupled to said collector of said seventh transistor.

17. The circuit of claim 1 further comprising a temperature compensation circuit for compensating variations in transistor properties caused by changes in ambient temperature, wherein said temperature compensation circuit is coupled to said collector of said first transistor.

18. The circuit of claim 17 wherein said compensation circuit comprises:
a first diode and a second diode, wherein said first diode is coupled in parallel to said second diode; and
a third resistive element, wherein a first end of said third resistive element is coupled in series to said first diode which is coupled in series to said second diode.

19. The circuit of claim 18 wherein a second end of said third resistive element is coupled to said collector of said first transistor, and wherein said first diode and said second diode are coupled to said collector of said second transistor.

20. The circuit of claim 1 further comprising:
a first temperature compensation circuit comprising a diode and a third resistive element, wherein said first temperature compensation circuit is coupled to ground and to said collector of said first transistor; and
a second temperature compensation circuit comprising a fourth resistive element coupled in series to a second diode coupled in series to a third diode, wherein said fourth resistive element is coupled to said collector of said transistor of said first transistor, and wherein said third diode is coupled to said collector of said second transistor.

21. The circuit of claim 1 further comprising:
a fifth transistor having an emitter, a base and a collector, wherein said collector of said first transistor is coupled to said collector of said fifth transistor, and wherein said emitter of said first transistor is coupled to said emitter of said fifth transistor;
a first logic input signal coupled to said base of said first transistor; and
a second logic input signal coupled to said base of said fifth transistor, wherein said first logic signal and said second logic signal are combined to produce a logic output signal at said collector of said fourth transistor, wherein said logic output signal represents a logical NOR operation between said first logic input signal and said second logic input signal.

22. The circuit of claim 1 further comprising a logic signal coupled to said base of said first transistor, wherein application of said logic signal to said base of said first transistor causes a logic output signal to appear at said collector of said fourth transistor, and wherein said logic output signal represents a logical NOT operation on said logic input signal.

23. The circuit of claim 1 further comprising:
a second reference potential coupled to said base of said first transistor; and
a logic input signal coupled to said base of said second transistor.

24. The circuit of claim 5 further comprising:
a second current source;
a sixth transistor having an emitter, a base and a collector, wherein said collector of said second transistor is coupled to said collector of said sixth transistor, and wherein said emitter of said sixth transistor is coupled to said emitter of said fifth transistor and to said current source;
a seventh transistor having an emitter, a base and a collector, wherein said emitter of said seventh transistor is coupled to said second current source;
a first logic input signal coupled to said base of said first transistor; and
a second logic input signal coupled to said base of said seventh transistor, wherein said first logic signal and said second logic signal are combined to produce a logic output signal at said collector of said fourth transistor, wherein said logic output signal represents a logical NAND operation between said first logic input signal and said second logic input signal.

25. A circuit comprising:
a first differential logic circuit having an input branch and an output branch, said output branch having at least a first and a second output state;
an active circuit element; and
a constant voltage source coupled to said output branch of said differential logic circuit, said constant voltage source for supplying a constant voltage signal to said output branch of said differential logic circuit so that the time required for said output branch to switch from said first output state to said second output state is substantially equal to the time required for said output branch to switch from said second output state to said first output state, wherein said output branch of said differential logic circuit is coupled to said constant voltage source through said active circuit element.

26. The circuit of claim 25 wherein the constant voltage source comprises:
a reference potential generator for generating a reference potential signal; and
a differential amplifier for comparing said reference potential signal with said constant voltage signal and generating a correction signal for adjusting said constant voltage signal.

27. The circuit of claim 26 wherein said differential amplifier is an operational amplifier.

28. The circuit of claim 26 wherein said reference potential generator comprises an emitter-coupled logic circuit.

29. The circuit of claim 25 wherein said output circuit comprises an emitter-follower circuit.

30. The circuit of claim 29 further comprising a second active circuit element which couples said emitter-follower circuit to ground.

31. The circuit of claim 25 wherein said input branch comprises an input active circuit element and said output branch comprises an output branch active circuit element, wherein said input active circuit element is coupled to said output branch active circuit element.

32. The circuit of claim 31 wherein said input active circuit element comprises a first bipolar transistor and said output branch active circuit element comprises a second bipolar transistor.

33. The circuit of claim 32 wherein each of said bipolar transistors comprises an emitter and wherein said emitter of said first bipolar transistor is coupled to said emitter of said second bipolar transistor.

34. The circuit of claim 33 further comprising a second differential logic circuit comprising an input branch and an output branch, wherein said second differential logic circuit is coupled to said constant voltage source.

35. The circuit of claim 34 wherein said input branch of said second differential logic circuit is coupled to said input branch of said first differential logic circuit.

36. The circuit of claim 34 wherein said output branch of said second differential logic circuit is coupled to said output branch of said first differential logic circuit.

37. The circuit of claim 33 wherein said input branch of said second differential logic circuit is coupled both to said input branch and to said output branch of said first differential logic circuit.

38. The circuit of claim 34 wherein said input branch of said first differential logic circuit is coupled to said output branch of said second differential logic circuit, and wherein said output branch of said first differential logic circuit is coupled to said input branch of said second differential logic circuit.

39. An integrated circuit comprising:

a first transistor and a second transistor, each of said transistors having an emitter, a base and a collector, wherein said emitter of said first transistor and said emitter of said second transistor are coupled together, and wherein said bases of said first and second transistor are defined as a first input terminal and a second input terminal, respectively;

a third transistor having an emitter, a base and a collector, wherein said base of said third transistor is coupled to said collector of said first transistor, and wherein said emitter of said third transistor is defined as an output terminal;

a first resistive element, said first resistive element being coupled to said collector of said second transistor and to said emitter of said third transistor;

a fourth transistor having an emitter, a base and a collector, wherein said emitter of said third transistor is coupled to said collector of said fourth transistor, and wherein said collector of said second transistor is coupled to said base of said fourth transistor;

a first reference potential;

a second resistive element coupled to said collector of said first transistor and to said first reference potential, wherein said collector of said third transistor is coupled to said first reference potential; and a constant voltage source, said constant voltage source generating a constant voltage signal, wherein said constant voltage source is coupled to said emitter of said fourth transistor, and wherein said constant voltage source is regulated such that the time required for said third transistor to switch from a substantially conducting state to a substantially non-conducting state is approximately equal to the time for said fourth transistor to switch from a substantially conducting state to a substantially non-conducting state.

* * * * *